US011563021B2

(12) United States Patent
Huang et al.

(10) Patent No.: US 11,563,021 B2
(45) Date of Patent: Jan. 24, 2023

(54) MEMORY DEVICE AND METHOD FOR FORMING THE SAME

(71) Applicant: Yangtze Memory Technologies Co., Ltd., Wuhan (CN)

(72) Inventors: Bo Huang, Wuhan (CN); Lei Xue, Wuhan (CN); Jiaqian Xue, Wuhan (CN); Tingting Gao, Wuhan (CN); Wanbo Geng, Wuhan (CN); Xiaoxin Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 229 days.

(21) Appl. No.: 16/892,439

(22) Filed: Jun. 4, 2020

(65) Prior Publication Data
US 2021/0265364 A1 Aug. 26, 2021

Related U.S. Application Data

(63) Continuation of application No. PCT/CN2020/076741, filed on Feb. 26, 2020.

(51) Int. Cl.
H01L 27/1157 (2017.01)
H01L 27/11524 (2017.01)
(Continued)

(52) U.S. Cl.
CPC .... *H01L 27/1157* (2013.01); *H01L 27/11524* (2013.01); *H01L 27/11539* (2013.01); *H01L 27/11551* (2013.01); *H01L 27/11578* (2013.01)

(58) Field of Classification Search
None
See application file for complete search history.

(56) References Cited

U.S. PATENT DOCUMENTS

2018/0130814 A1* 5/2018 Lee ..................... H01L 27/1157
2019/0355735 A1 11/2019 Kothari et al.

FOREIGN PATENT DOCUMENTS

CN 105374825 A 3/2016
CN 107293544 A 10/2017
(Continued)

OTHER PUBLICATIONS

The World Intellectual Property Organization (WIPO) International Search Report for PCT/CN2020/076741 dated Dec. 1, 2020 4 pages.

*Primary Examiner* — Anthony Ho
*Assistant Examiner* — Kevin Quinto
(74) *Attorney, Agent, or Firm* — Anova Law Group, PLLC

(57) ABSTRACT

A method for forming a memory device includes providing an initial semiconductor structure, including a base substrate; a first sacrificial layer formed on the base substrate; a stack structure, disposed on the first sacrificial layer; a plurality of channels, formed through the stack structure and the first sacrificial layer; and a gate-line trench, formed through the stack structure and exposing the first sacrificial layer. The method also includes forming at least one protective layer on the sidewalls of the gate-line trench; removing the first sacrificial layer to expose a portion of each of the plurality of channels and the surfaces of the base substrate, using the at least one protective layer as an etch mask; and forming an epitaxial layer on the exposed surfaces of the base substrate and the plurality of channels.

20 Claims, 30 Drawing Sheets

(51) Int. Cl.
*H01L 27/11539* (2017.01)
*H01L 27/11551* (2017.01)
*H01L 27/11578* (2017.01)

(56) References Cited

FOREIGN PATENT DOCUMENTS

| | | |
|---|---|---|
| CN | 108140643 A | 6/2018 |
| CN | 110462829 A | 11/2019 |
| CN | 110752214 A | 2/2020 |
| CN | 110767655 A | 2/2020 |
| TW | 201607045 A | 2/2016 |

* cited by examiner

| Step | Description |
|---|---|
| S501 | Providing an initial semiconductor structure, including a base substrate; a first sacrificial layer formed on the base substrate; a stack structure, disposed on the first sacrificial layer and including alternately-arranged interlayer dielectric layers and sacrificial layers; channels formed through the stack structure and the first sacrificial layer; a tunneling layer, an electron trapping layer, and a blocking layer sequentially disposed on sidewalls of each channel; a gate-line capping layer, formed on the stack structure; and a gate-line trench, formed through the gate-line capping layer and the stack structure, and exposing the first sacrificial layer |
| S502 | Sequentially forming a first protective layer made of a first material on the bottom and sidewalls of the gate-line trench and the top surface of the gate-line capping layer and forming a second protective layer made of a second material on the first protective layer, the second material being different from the first material |
| S503 | Removing the portion of the first protective layer and the second protective layer formed on the bottom of the gate-line trench |
| S504 | Forming a third protective layer made of the first material on the second protective layer and the first sacrificial layer exposed at the bottom of the gate-line trench |
| S505 | Removing a portion of the third protective layer formed on the bottom of the gate-line trench |
| S506 | Removing the first sacrificial layer to expose a portion of the blocking layer using the first protective layer, the second protective layer, and the third protective layer as an etch mask |
| S507 | Removing the exposed portion of the blocking layer using the first protective layer, the second protective layer, and the third protective layer as an etch mask |
| S508 | Removing a portion of the electron trapping layer and the tunneling layer to expose each channel and removing the third protective layer |
| S509 | Forming an epitaxial layer on exposed surfaces of the base substrate and the channels |
| S510 | Removing the second protective layer |
| S511 | Removing the first protective layer and the sacrificial layers |

FIG. 3

MEMORY DEVICE AND METHOD FOR FORMING THE SAME

CROSS-REFERENCE TO RELATED APPLICATION

This application is a continuation of International Application No. PCT/CN2020/076741, filed on Feb. 26, 2020, the entire content of which is incorporated herein by reference.

FIELD OF THE DISCLOSURE

The present disclosure generally relates to the field of semiconductor fabrication technology and, more particularly, relates to memory devices and their fabrication methods.

BACKGROUND

The production process of semiconductor electronic has made great progress with the development of the planar flash memory. However, in recent years, the continuous development of the planar flash memory encountered a number of challenges, such as physical limits, existing lithography limits, storage electron density limits, etc. In this context, in order to solve the difficulties encountered by the planar flash memory and pursue lower production cost per storage unit, various three-dimensional (3D) flash memory structures, including 3D not-or (NOR) and 3D not-and (NAND), have emerged.

In the 3D flash memory of the NOR type structure, the storage units are arranged in parallel between the bit line and the ground line, while in the 3D flash memory of the NAND type structure, the storage units are arranged in series between the bit line and the ground line. An NAND flash memory with a tandem structure has a lower read speed, but has a higher write speed and erase speed. Therefore, the NAND flash memory is suitable for storing data. In addition, the NAND flash memory also demonstrates many advantages, such as small unit size and large storage capacity, for data storage.

A 3D NAND flash memory includes a stack structure. The stack structure includes a plurality of silicon nitride layers and a plurality of silicon oxide layers that are alternately arranged. That is, a 3D NAND flash memory includes a multi-layer of nitride-oxide (NO) stack structure. In the case that the number of layers in the NO stack structure is greater than or equal to 128, during the fabrication process, sidewall selective epitaxial growth (SEG) is commonly used. The structure formed by the sidewall SEG is typically L-shaped, and a portion of the structure is grown from the sidewall of the channel. Accordingly, prior to the sidewall SEG, an oxide-nitride-oxide (ONO) structure located at the bottom part of the channel needs to be removed. However, because the film properties of the ONO structure located at the lower end of the channel is similar to the film properties of the NO stack structure, when removing the ONO structure, the NO stack structure may also be damaged, which causes undesired performance for the formed 3D NAND flash memory.

The disclosed methods for forming memory devices are directed to solve one or more problems set forth above and other problems in the art.

BRIEF SUMMARY OF THE DISCLOSURE

One aspect of the present disclosure provides a method for forming a memory device. The method includes providing an initial semiconductor structure, including a base substrate; a first sacrificial layer formed on the base substrate; a stack structure, disposed on the first sacrificial layer; a plurality of channels, formed through the stack structure and the first sacrificial layer; and a gate-line trench, formed through the stack structure and exposing the first sacrificial layer. The method also includes forming at least one protective layer on the sidewalls of the gate-line trench; removing the first sacrificial layer to expose a portion of each of the plurality of channels and the surfaces of the base substrate, using the at least one protective layer as an etch mask; and forming an epitaxial layer on the exposed surfaces of the base substrate and the plurality of channels.

Another aspect of the present disclosure provides a method for forming a memory device. The method includes providing an initial semiconductor structure, including a base substrate; a first stop layer formed on the base substrate; a first sacrificial layer formed on the first stop layer; a second stop layer disposed on the first sacrificial layer; a stack structure, disposed on the second stop layer; a plurality of channels formed through the stack structure and into the base substrate; and a gate-line trench, formed through the stack structure and exposing the first sacrificial layer. The method further includes forming a protective layer on the bottom and sidewalls of the gate-line trench; removing a portion of the protective layer formed on the bottom of the gate-line trench; removing the first sacrificial layer to expose a portion of each of the plurality of channels and the surfaces of the base substrate, using the protective layer as an etch mask; and forming an epitaxial layer on the exposed surfaces of the base substrate and the plurality of channels.

Another aspect of the present disclosure provides a method for forming a memory device. The method includes providing an initial semiconductor structure, including a base substrate; a first sacrificial layer formed on the base substrate; a stack structure, disposed on the first sacrificial layer and including a plurality of interlayer dielectric layers and a plurality of sacrificial layers that are alternately arranged; a plurality of channels formed through the stack structure and the first sacrificial layer; a tunneling layer, an electron trapping layer, and a blocking layer sequentially disposed on sidewalls of each channel; a gate-line capping layer, formed on the stack structure; and a gate-line trench, formed through the gate-line capping layer and the stack structure and exposing the first sacrificial layer. The method also includes sequentially forming a first protective layer made of a first material on a bottom and sidewalls of the gate-line trench and a top surface of the gate-line capping layer, forming a second protective layer made of a second material on the first protective layer, forming a third protective layer made of a third material on the second protective layer. The first material, the second material and the third material are different from each other. The method further includes removing a portion of the first protective layer, the second protective layer, and the third protective layer formed on the bottom of the gate-line trench; removing the first sacrificial layer using the first protective layer, the second protective layer, and third protective layer as an etch mask to expose a portion of the blocking layer; removing the exposed portion of the blocking layer using the first protective layer, the second protective layer, and third protective layer as an etch mask; removing a portion of the electron trapping layer and the tunneling layer to expose each channel; and forming an epitaxial layer on exposed surfaces of the base substrate and the plurality of channels.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 3 illustrates a flowchart of an exemplary method for forming a memory device according to various embodiments of the present disclosure;

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
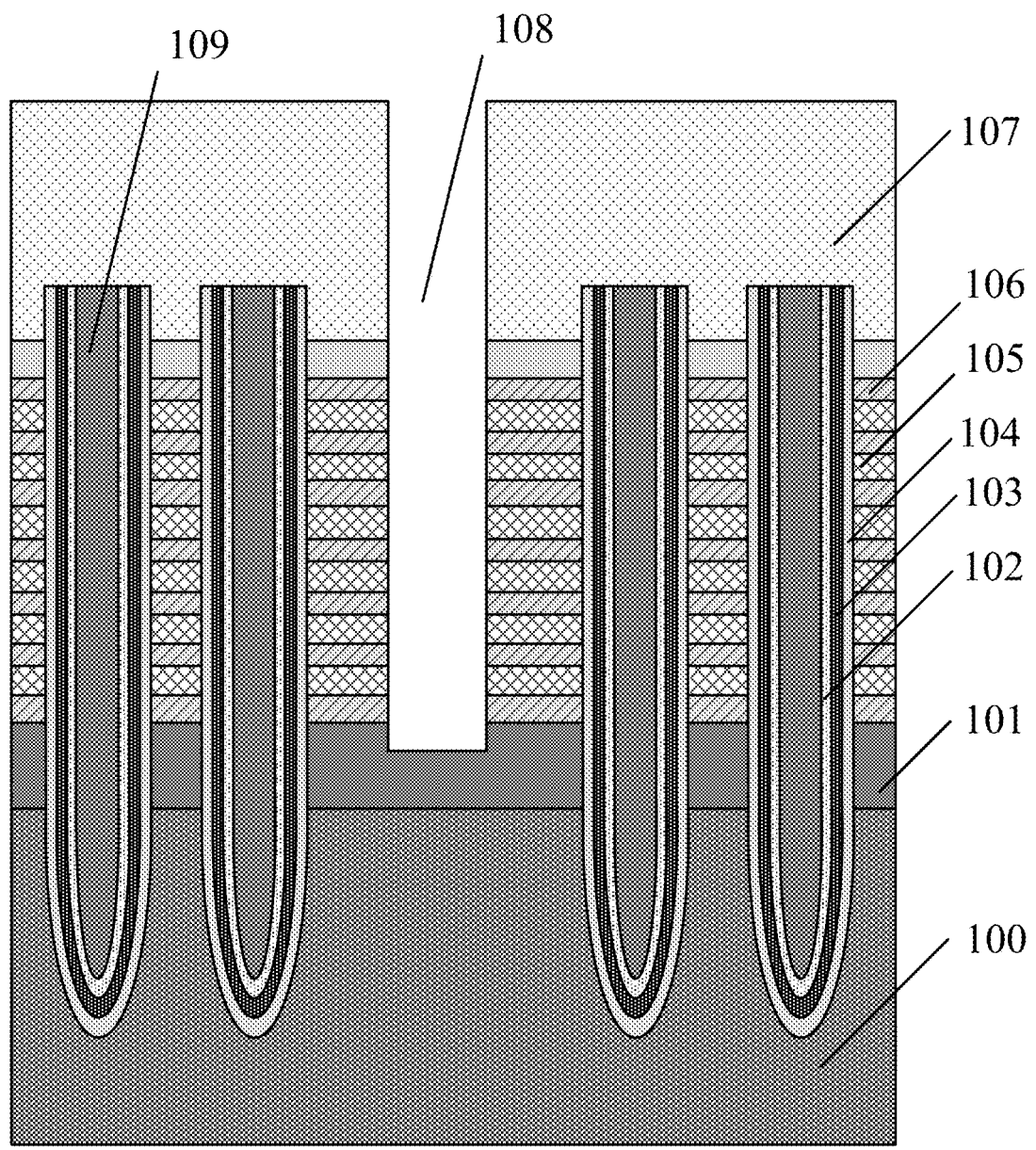
FIGS. 1-2 illustrate schematic views of semiconductor structures at certain stages of a fabrication process of a 3D NAND flash memory.
Figure 2:
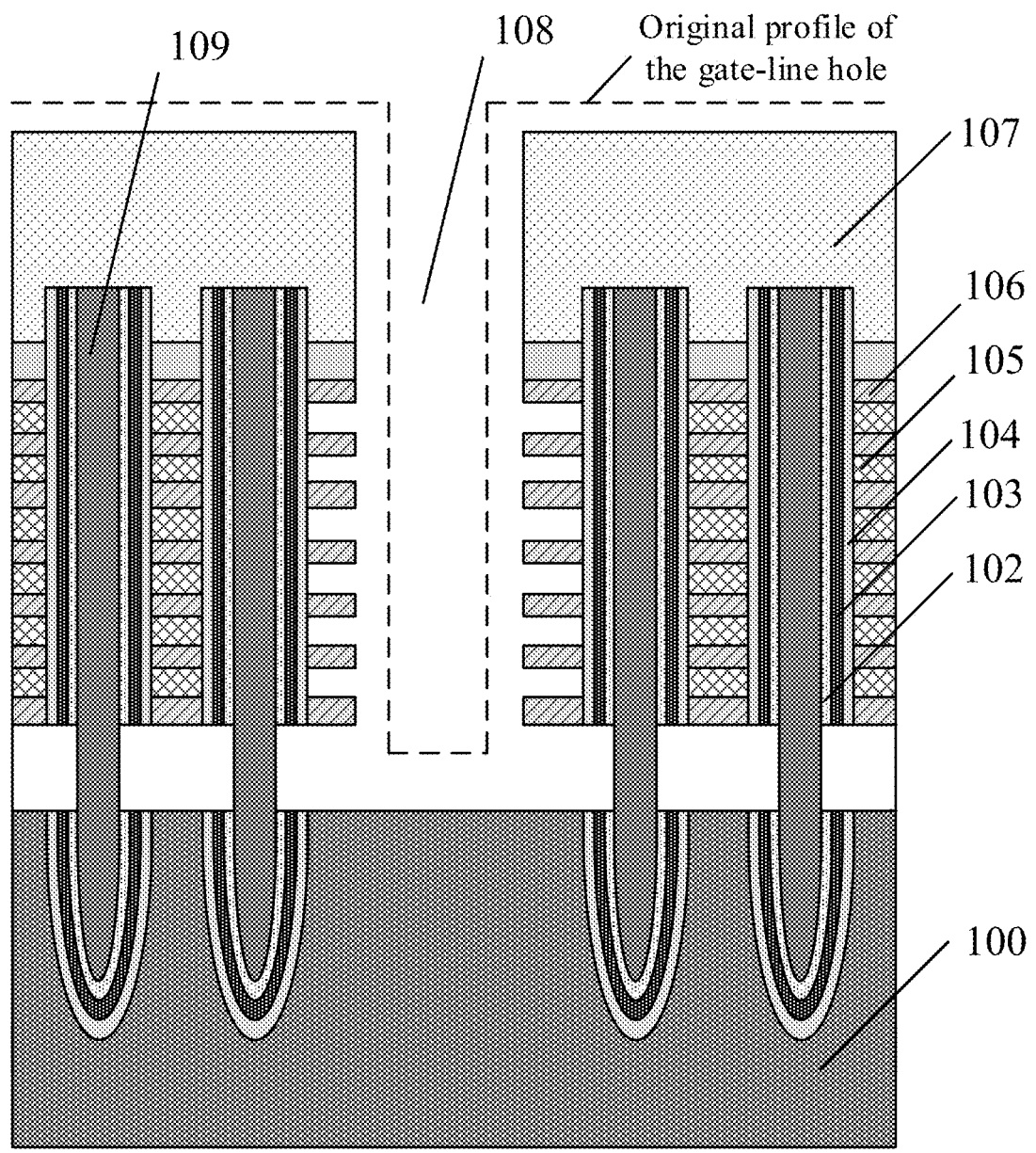

FIGS. 1-2 illustrate schematic views of semiconductor structures at certain stages of a fabrication process of a 3D NAND flash memory. Referring to FIG. 1, during the fabrication process of a 3D NAND flash memory, a first sacrificial layer 101 is formed on a base substrate 100. The first sacrificial layer 101 is made of polycrystalline silicon. A stack structure formed by a plurality of interlayer dielectric layers 106 and a plurality of sacrificial layers 105 is then formed on the first sacrificial layer 101. The plurality of interlayer dielectric layers 106 and the plurality of sacrificial layers 105 are alternately arranged along a direction perpendicular to the surface of the base substrate 100. The plurality of sacrificial layers 105 is made of silicon nitride and the plurality of interlayer dielectric layers 106 is made of silicon oxide, so that the stack structure includes multi-layered nitride-oxide (NO) stack structure.

Referring to FIG. 1, a plurality of channels 109 is formed through the NO stack structure, including a plurality of NO stacks, and the first sacrificial layer 101. A tunneling layer 102, an electron trapping layer 103, and a blocking layer 104 are sequentially disposed on the sidewall surface of each channel 109 to separate the channel 109 from the NO stack structure and the first sacrificial layer 101. The channel 109 is made of polycrystalline silicon, the tunneling layer 102 is made of an oxide, e.g. silicon oxynitride, the electron trapping layer 103 is made of a nitride, e.g. silicon nitride, and the blocking layer 104 is made of an oxide, e.g. silicon oxide. That is, an oxide-nitride-oxide (ONO) structure is formed on the sidewall surface of each channel 109. Moreover, a gate-line capping layer 107 is formed on the top surface of the NO stack structure. The gate-line capping layer 107 is made of silicon oxide and covers the plurality of channels 109.

Referring to FIG. 1, a gate-line trench 108 is formed through the NO stack structure to expose the first sacrificial layer 101. That is, the bottom surface of the gate-line trench 108 is formed in the first sacrificial layer 101.

Further, referring to FIG. 2, the first sacrificial layer 101 is removed, and a portion of the ONO structure formed on the bottom part of each channel 109, including the tunneling layer 102, the electron trapping layer 103, and the blocking layer 104, is also removed. As such, a portion of the channel 109 and the top surface of the base substrate are exposed. Further, in a subsequent selective epitaxial growth (SEG) process, silicon can epitaxially grow on the surface of the base substrate 100 and the sidewall surface of the channel 109.

However, the properties of the ONO structure are substantially similar to the properties of the NO stack structure. Therefore, the process of removing the portion of the ONO structure formed on the bottom part of each channel 109 may also cause substantial damage to the NO stack structure and the gate-line capping layer 107. In FIG. 2, the dashed line indicates the original profile of the gate-line trench, and the arrows schematically illustrate the evolution of the profile of the gate-line trench in the process of removing the portion of the ONO structure formed on the bottom part of each channel 109. For example, during the process, the thickness of the gate-line capping layer 107 may be reduced, the dimension of the gate-line trench may be enlarged, and the plurality of interlayer dielectric layers 106 and the plurality of sacrificial layers 105 may be damaged. Moreover, during a subsequent SEG of silicon, defects may be formed on the surface of the sacrificial layer 105. As such, the electrical performance of the formed 3D NAND flash memory may be degraded.

The present disclosure provides a memory device and a method for forming the memory device. FIG. 3 illustrates a flowchart of an exemplary method according to various embodiments of the present disclosure, and FIGS. 4-14 illustrate schematic views of semiconductor structures at certain stages of the exemplary method.

Figure 4:
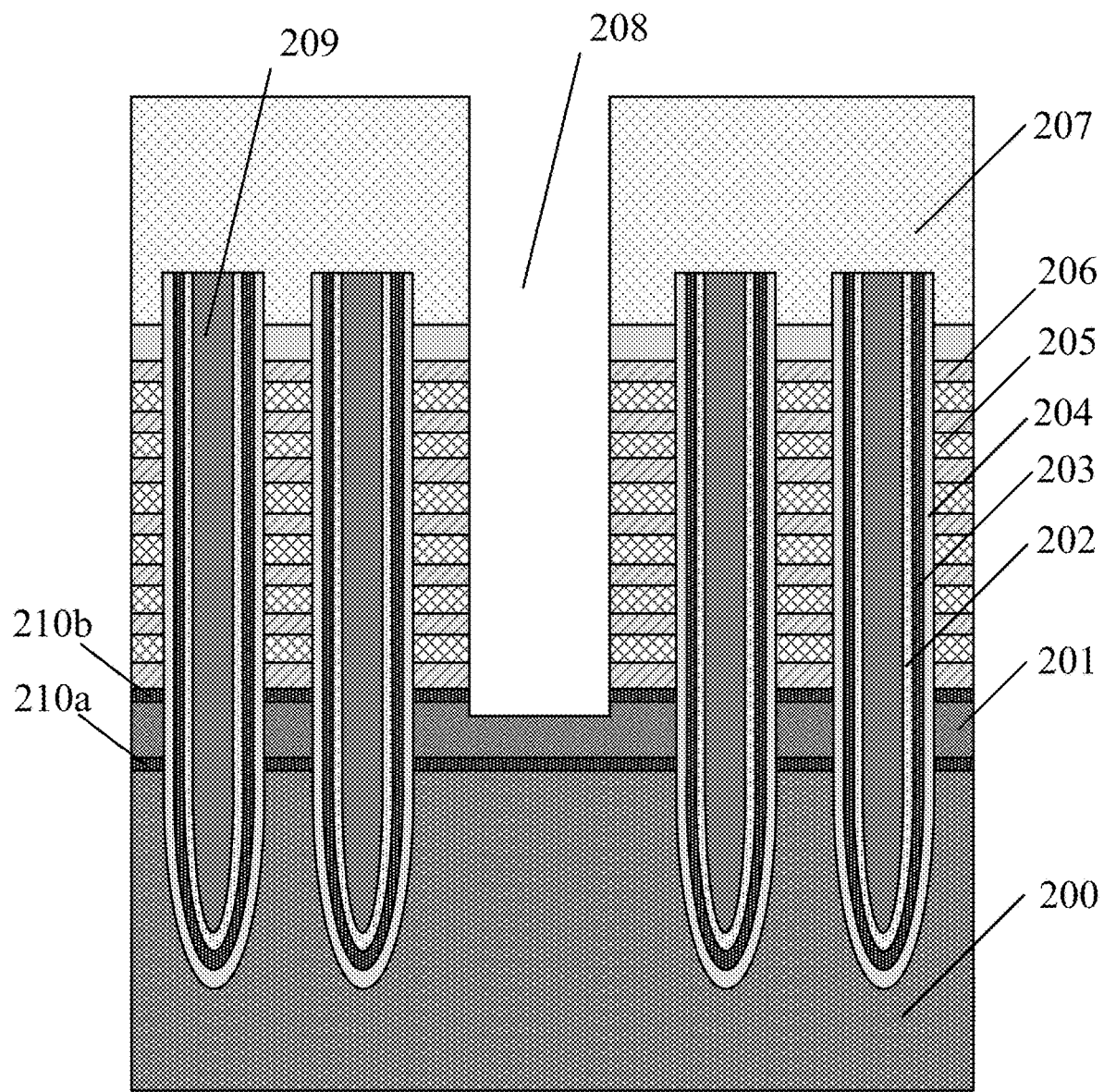
FIGS. 4-14 illustrate schematic views of semiconductor structures at certain stages of an exemplary method for forming a memory device according to various embodiments of the present disclosure.

Referring to FIG. 3, an initial semiconductor structure may be provided, and the initial semiconductor structure may include a base substrate; a first sacrificial layer formed on the base substrate; a stack structure, disposed on the first sacrificial layer and including a plurality of interlayer dielectric layers and a plurality of sacrificial layers that are alternately arranged; a plurality of channels formed through the stack structure and the first sacrificial layer; a tunneling layer, an electron trapping layer, and a blocking layer sequentially disposed on the sidewall surface of each channel to separate the channel from the stack structure and the first sacrificial layer; and a gate-line trench formed through the stack structure to expose the first sacrificial layer (S501). FIG. 4 illustrates a schematic cross-sectional view of a semiconductor structure consistent with various embodiments of the present disclosure.

Referring to FIG. 4, an initial semiconductor structure may be provided. The initial semiconductor structure may include a base substrate 200, and a first sacrificial layer 201 formed on the base substrate 200. The base substrate 200 may be made of silicon, germanium, silicon germanium, or any appropriate semiconductor material. The first sacrificial layer 201 may be made of polycrystalline silicon.

In one embodiment, the initial semiconductor structure may also include a first stop layer 210a formed between the base substrate 200 and the first sacrificial layer 201, and a second stop layer 210b formed on the first sacrificial layer 201. The first stop layer 210a and the second stop layer 210b may be made of silicon oxide, silicon nitride, or any other appropriate material. Moreover, the first stop layer 210a and the second stop layer 210b may serve as stop layers during a subsequent process of removing the first sacrificial layer 201.

Further, the initial semiconductor structure may include a stack structure formed on the first sacrificial layer 201. The stack structure may include a plurality of interlayer dielectric layers 206 and a plurality of sacrificial layers 205 that are alternately arranged. In some embodiments, the plurality of sacrificial layers 205 may be made of a nitride, e.g. silicon nitride, and the plurality of interlayer dielectric layers 206 may be made of an oxide, e.g. silicon oxide. The stack structure may be an NO stack structure including a plurality of NO stacks.

In one embodiment, the initial semiconductor structure may include a plurality of channels 209 formed through the NO stack structure and the first sacrificial layer 201. Further, the initial semiconductor structure may include a tunneling layer 202, an electron trapping layer 203, and a blocking layer 204 sequentially disposed on the sidewall surface of each channel 209 to separate the channel 209 from the NO stack structure and the first sacrificial layer 201. The channel 209 may be made of polycrystalline silicon, the tunneling layer 202 may be made of an oxide, e.g. silicon oxynitride, the electron trapping layer 203 may be made of a nitride, e.g. silicon nitride, and the blocking layer 204 may be made of an oxide, e.g. silicon oxide. That is, an ONO structure may be formed on the sidewall surface of each channel 209.

Referring to FIG. 4, the initial semiconductor structure may include a gate-line trench 208 formed through the NO stack structure to expose the first sacrificial layer 201. The bottom surface of the gate-line trench 208 may be formed in the first sacrificial layer 201. In one embodiment, when the second stop layer 210b is formed on the first sacrificial layer 201, the gate-line trench 208 may penetrate the second stop layer 210b to expose the first sacrificial layer 201.

In one embodiment, the initial semiconductor structure may include a gate-line capping layer 207 formed on the top surface of the NO stack structure. The gate-line capping layer 207 may be made of an oxide, e.g. silicon oxide, and may cover the plurality of channels 209. Correspondingly, the gate-line trench 208 may also penetrate the gate-line capping layer 207.

Figure 5:
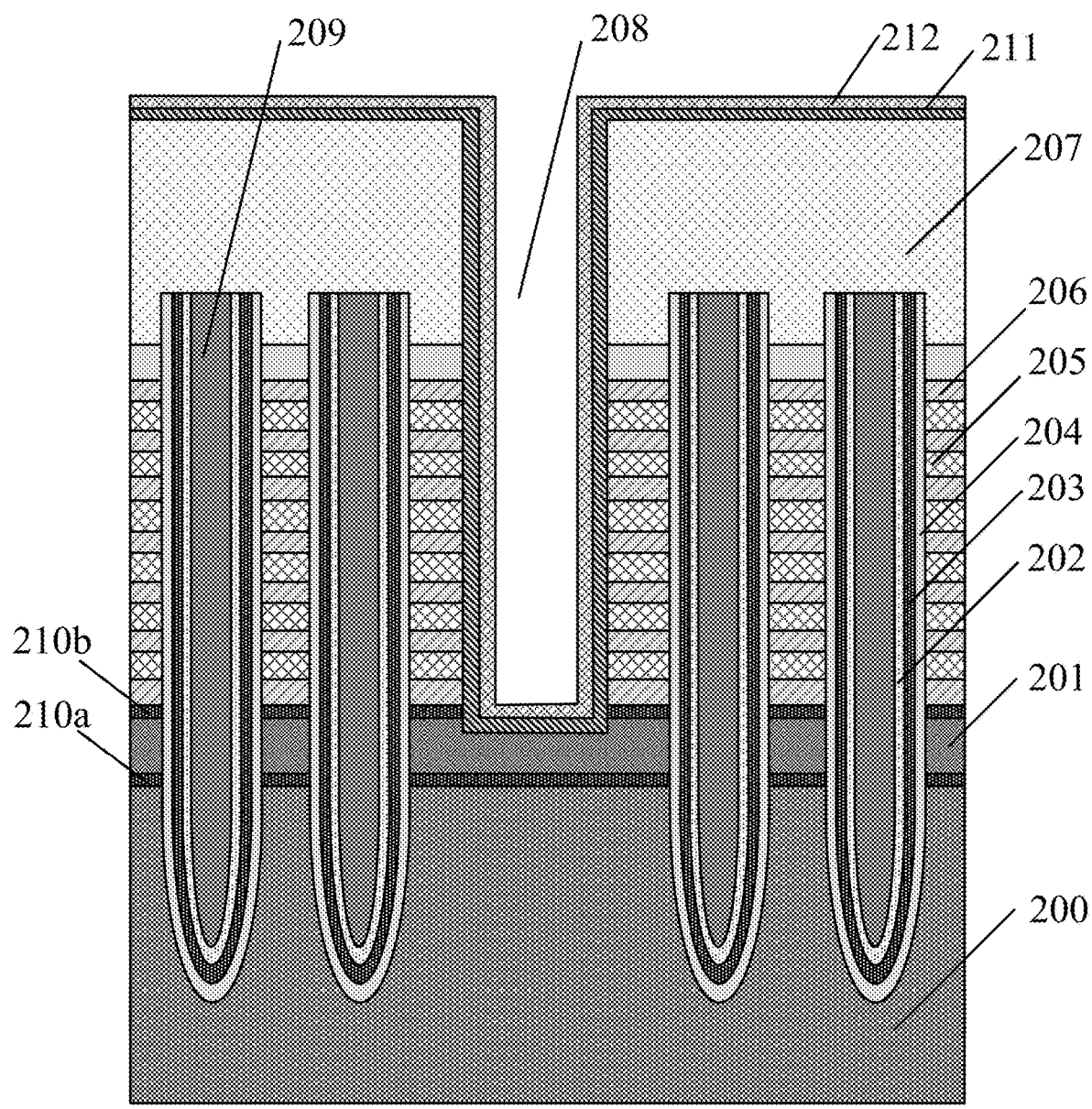

Further, referring back to FIG. 3, a first protective layer made of a first material and a second protective layer made of a second material may be sequentially formed on the bottom and sidewalls of the gate-line trench (S502). FIG. 5 illustrates a schematic cross-sectional view of a semiconductor structure consistent with various embodiments of the present disclosure.

Referring to FIG. 5, a first protective layer 211 may be formed on the bottom and sidewalls of the gate-line trench 208. The first protective layer 211 may also cover the surface of the gate-line capping layer 207. Further, a second protective layer 212 may be formed on the first protective layer 211. In one embodiment, the first protective layer 211 may be made of a first material, and the second protective layer 212 may be made of a second material. The second material may be different from the first material. For example, the first material may include silicon nitride, and the second material may include silicon oxide. In one embodiment, each of the first protective layer 211 and the second protective layer 212 may be formed by an atomic layer deposition (ALD) process, a chemical vapor deposition (CVD) process, or other appropriate deposition process.

The thickness of the first protective layer 211 may not be too small or too large. When the thickness of the first protective layer 211 is too small, the first protective layer 211 may not be able to provide sufficient protection for the NO stack structure and the gate-line capping layer 207 in subsequent fabrication processes. However, when the thickness of the first protective layer 211 is too large, the overall thickness of the film layers formed on the sidewall surface of the gate-line trench 208 may be too large, making the subsequent removal of the first sacrificial layer 201 difficult. In addition, an overly large thickness may also make the first protective layer 211 difficult to be removed in a subsequent process. Therefore, in one embodiment, the thickness of the first protective layer 211 may be in a range of approximately 2 nm to 5 nm.

The thickness of the second protective layer 212 may not be too small or too large. When the thickness of the second protective layer 212 is too small, the second protective layer 212 may not be able to provide sufficient protection for the first protective layer 211 in subsequent fabrication processes. However, when the thickness of the second protective layer 212 is too large, the overall thickness of the film layers formed on the sidewall surface of the gate-line trench 208 may be too large, making the subsequent removal of the first sacrificial layer 201 difficult. In addition, an overly large thickness may also make the second protective layer 212 difficult to be removed in a subsequent process. Therefore, in one embodiment, the thickness of the second protective layer 212 may be in a range of approximately 10 nm to 15 nm.

Figure 6:
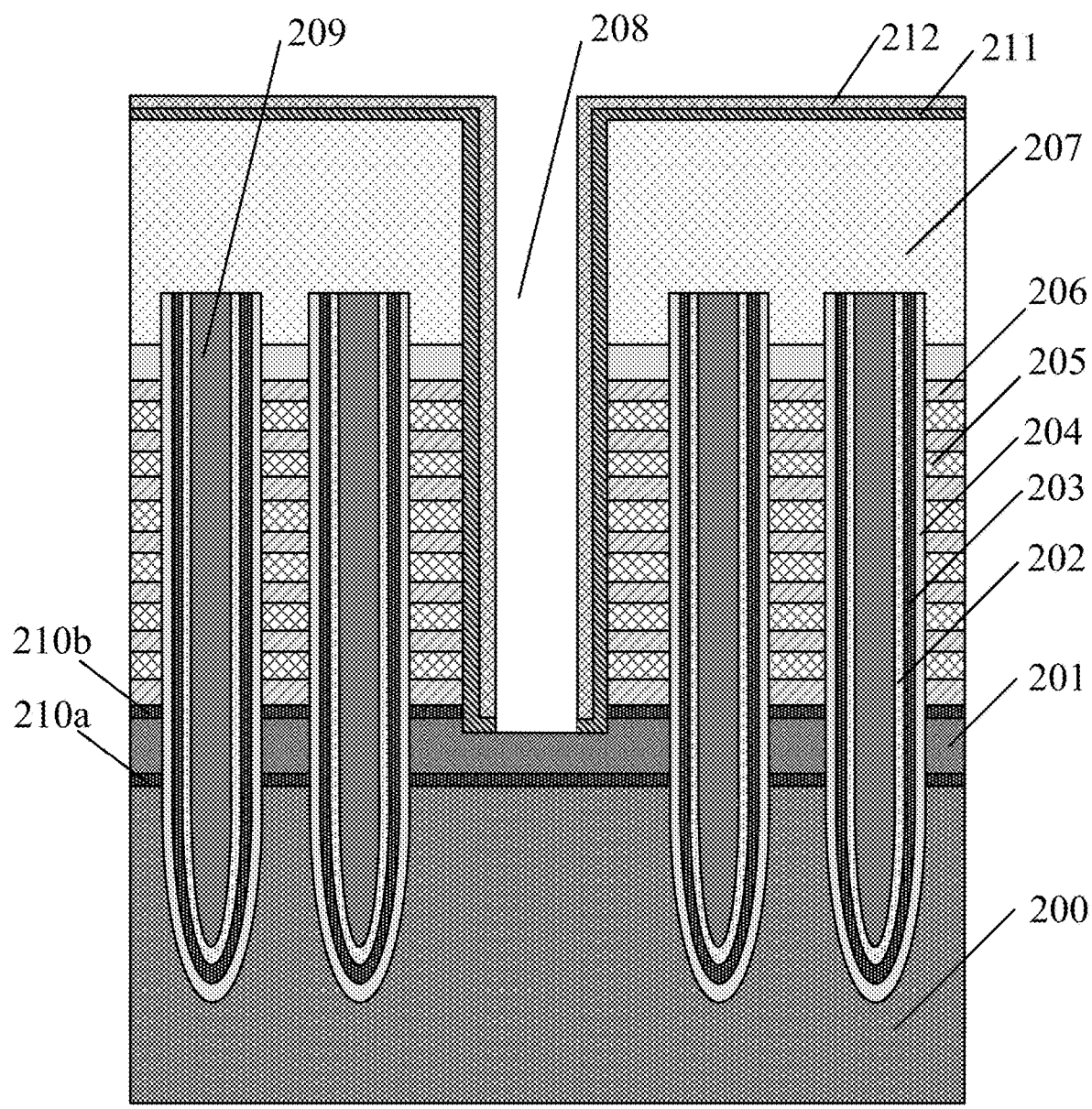

Further, referring back to FIG. 3, the portion of the first protective layer and the second protective layer formed on the bottom of the gate-line trench may be removed to expose the first sacrificial layer (S503). FIG. 6 illustrates a schematic cross-sectional view of a semiconductor structure consistent with various embodiments of the present disclosure.

Referring to FIG. 6, a portion of the first protective layer 211 and the second protective layer 212 formed on the bottom of the gate-line trench 208 may be removed to expose the first sacrificial layer 201. In one embodiment, the portion of the first protective layer 211 and the second protective layer 212 may be removed by a dry etching process.

Figure 7:
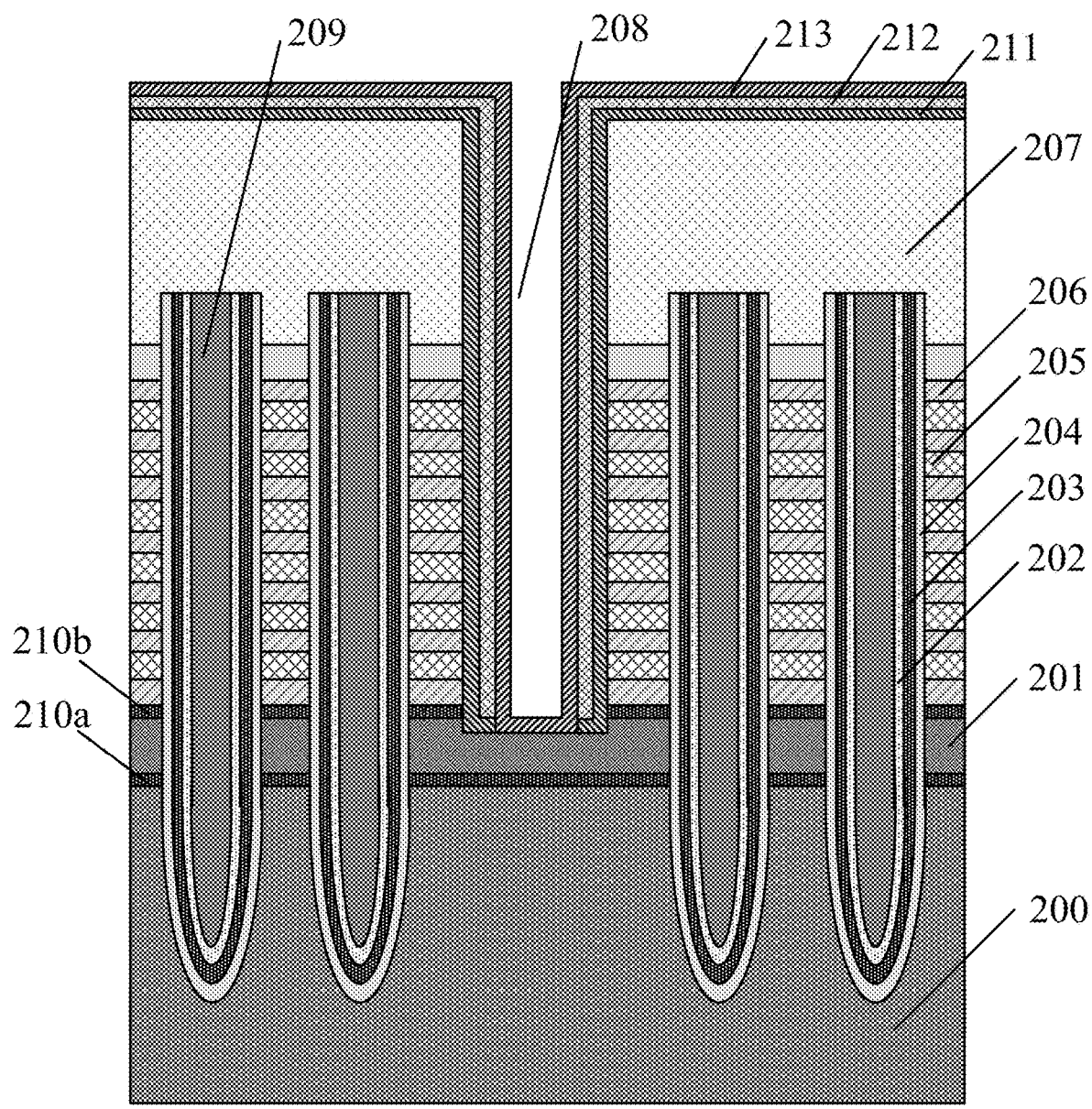

Further, referring to FIG. 3, a third protective layer made of the first material may be formed on the second protective layer and on the exposed portion of the first sacrificial layer at the bottom of the gate-line trench (S504). FIG. 7 illustrates a schematic cross-sectional view of a semiconductor structure consistent with various embodiments of the present disclosure.

Referring to FIG. 7, a third protective layer 213 may be formed on the second protective layer 212 and the first sacrificial layer 201 exposed at the bottom of the gate-line trench 208. In one embodiment, the third protective layer 213 may be made of the first material. That is, the material used for forming the third protective layer 213 may be the same as the material used for forming the first protective layer 211. For example, the first protective layer 211 and the third protective layer 213 may be made of silicon nitride.

The third protective layer 213 may be formed by an ALD process, a CVD process, or other appropriate deposition process.

The thickness of the third protective layer 213 may not be too small or too large. When the thickness of the third protective layer 213 is too small, the third protective layer 213 may not be able to provide sufficient protection for the second protective layer 212 and the first protective layer 211 in subsequent fabrication processes. However, when the thickness of the third protective layer 213 is too large, the overall thickness of the film layers formed on the sidewall surface of the gate-line trench 208 may be too large, making the subsequent removal of the first sacrificial layer 201 difficult. In addition, an overly large thickness may also make the third protective layer 213 difficult to be removed in a subsequent process. Therefore, in one embodiment, the thickness of the third protective layer 213 may be in a range of approximately 15 nm to 30 nm.

It should be noted that, after forming the third protective layer 213, the sidewall surface of the gate-line trench 208 may be sequentially covered by the first protective layer 211, the second protective layer 212, and the third protective layer 213. In one embodiment, because the first protective layer 211, the second protective layer 212, and the third protective layer 213 are made of silicon nitride, silicon oxide, and silicon nitride, respectively, the sidewall surface of the gate-line trench 208 may thus be covered by a nitride-oxide-nitride (NON) structure.

Figure 8:
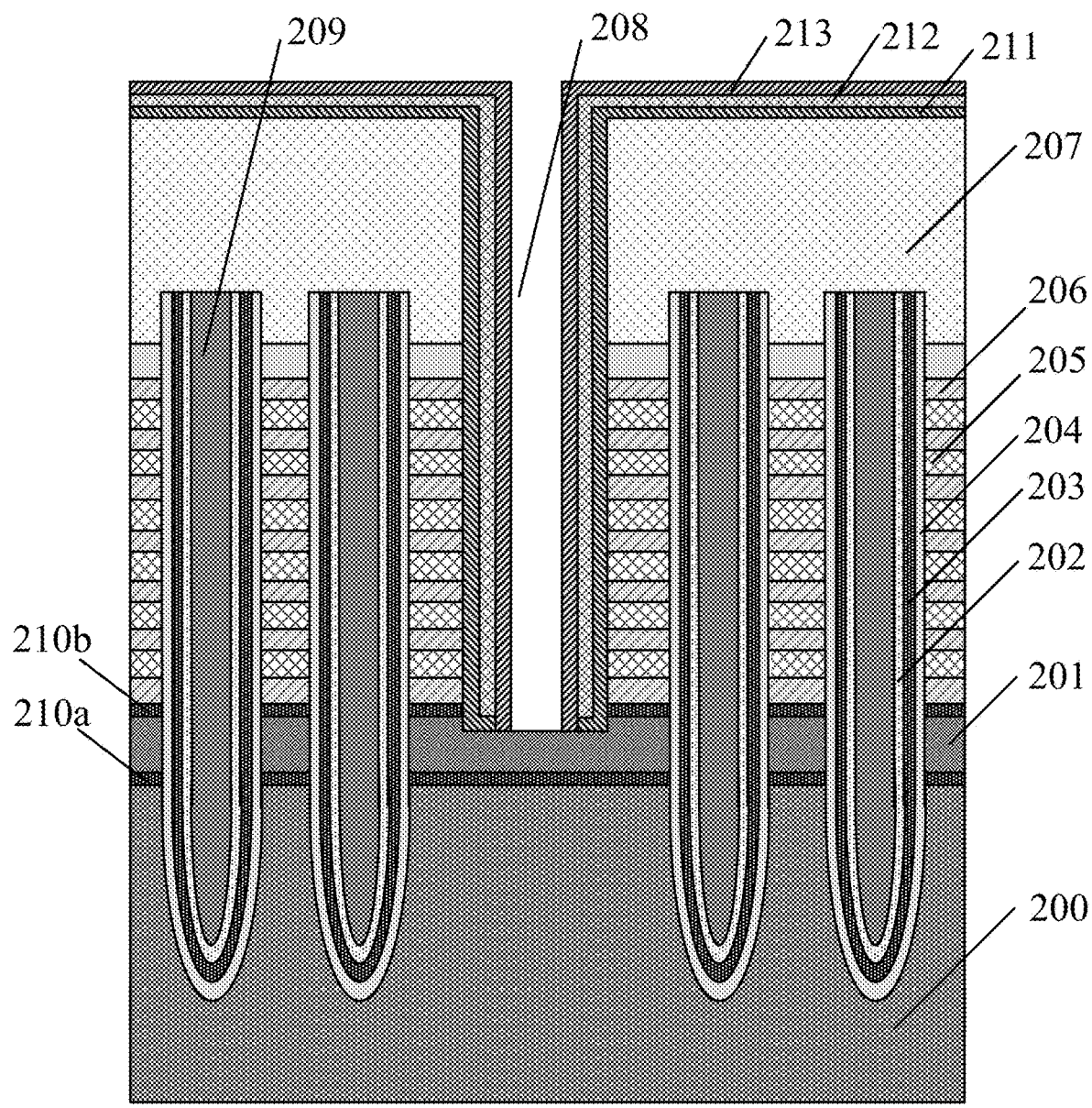

Further, referring to FIG. 3, the portion of the third protective layer formed on the bottom of the gate-line trench may be removed to expose the first sacrificial layer (S505). FIG. 8 illustrates a schematic cross-sectional view of a semiconductor structure consistent with various embodiments of the present disclosure.

Referring to FIG. 8, the portion of the third protective layer 213 formed on the bottom of the gate-line trench 208 may be removed to expose the first sacrificial layer 201. In one embodiment, the portion of the third protective layer 213 formed on the bottom of the gate-line trench 208 may be removed by a dry etching process. After removing the portion of the third protective layer 213, the third protective layer 213 may be directly connected to the first protective layer 211 at the bottom corner of the gate-line trench 208.

Figure 9:
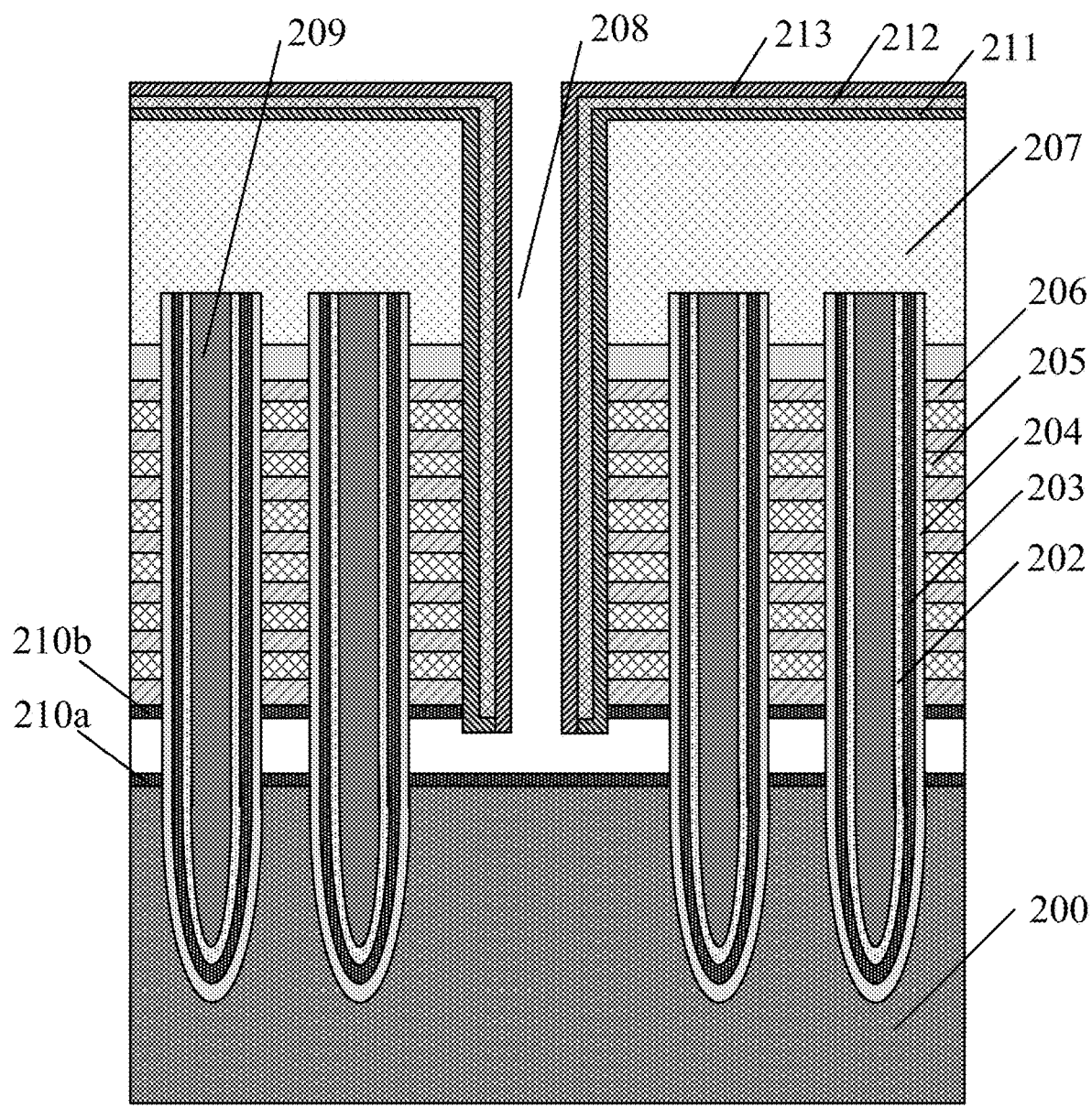

Further, referring to FIG. 3, the first sacrificial layer may be removed using the first protective layer, the second protective layer, and the third protective layer as an etch mask to expose a portion of the blocking layer (S506). FIG. 9 illustrates a schematic cross-sectional view of a semiconductor structure consistent with various embodiments of the present disclosure.

Referring to FIG. 9, the first sacrificial layer 201 may be removed using the first protective layer 211, the second protective layer 212, and the third protective layer 213 as an etch mask. In one embodiment, because the first sacrificial layer 201 is made of polycrystalline silicon, the first sacrificial layer 201 may be removed by a highly selective etching process which is capable of removing polycrystalline silicon while having limited etching effect on silicon nitride. In one embodiment, the first sacrificial layer 201 may be removed by a dry etching process. For example, a chlorine-containing gas, or any other appropriate gas having a high etching ratio on polycrystalline silicon and a low etching ratio on silicon nitride may be used as an etching gas for the removal of the first sacrificial layer 201.

It should be noted that, after removing the first sacrificial layer 201, a portion of the blocking layer 204 formed on each channel 209 may be exposed.

Figure 10:
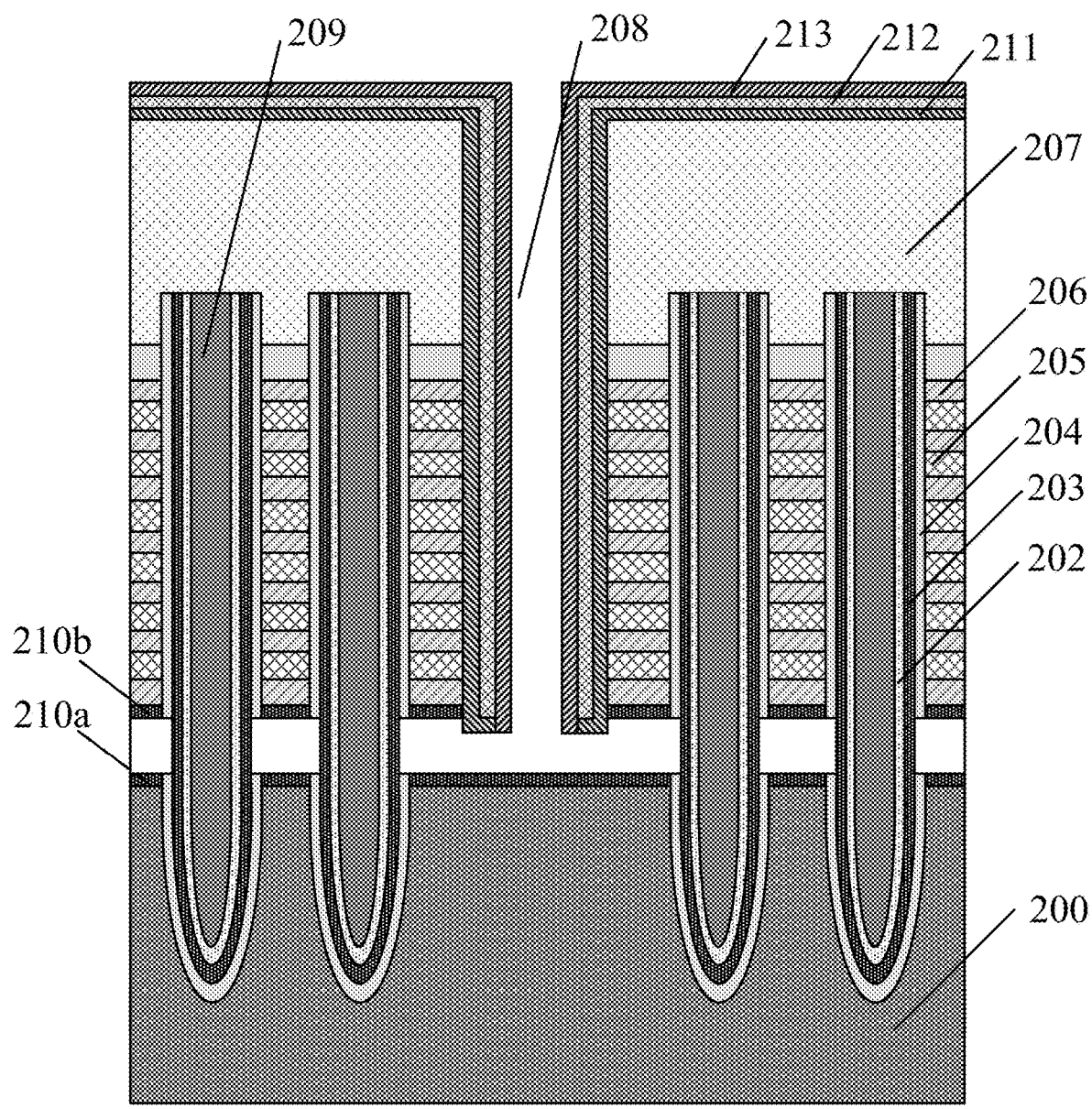

Further, returning to FIG. 3, the exposed portion of the blocking layer may be removed using the first protective layer, the second protective layer, and the third protective layer as an etch mask (S507). FIG. 10 illustrates a schematic cross-sectional view of a semiconductor structure consistent with various embodiments of the present disclosure.

Referring to FIG. 10, the exposed portion of the blocking layer 204 may be removed using the first protective layer 211, the second protective layer 212, and the third protective layer 213 as an etch mask, such that the electron trapping layer 203 may be partially exposed. In one embodiment, the portion of the blocking layer 204 exposed after removing the first sacrificial layer 201 (referring to FIG. 8) may be exposed by a wet etching process. For example, a buffered oxide etching (BOE) process using diluted hydrofluoric acid as an etchant may be adopted to remove the blocking layer 204. Because the diluted hydrofluoric acid demonstrates a substantially higher etching ratio on silicon oxide than on silicon nitride, during the removal of the blocking layer 204, the third protective layer 213 and the first protective layer 211 may not be removed. In one embodiment, the first stop layer 210a and the second stop layer 210b are made of silicon nitride, and correspondingly, when removing the blocking layer 204, the first stop layer 210a and the second stop layer 210b may not be removed. In other embodiments, the first stop layer 210a and the second stop layer 210b are made of silicon oxide, and thus the first stop layer 210a and the second stop layer 210b may be removed when removing the blocking layer 204.

Figure 11:
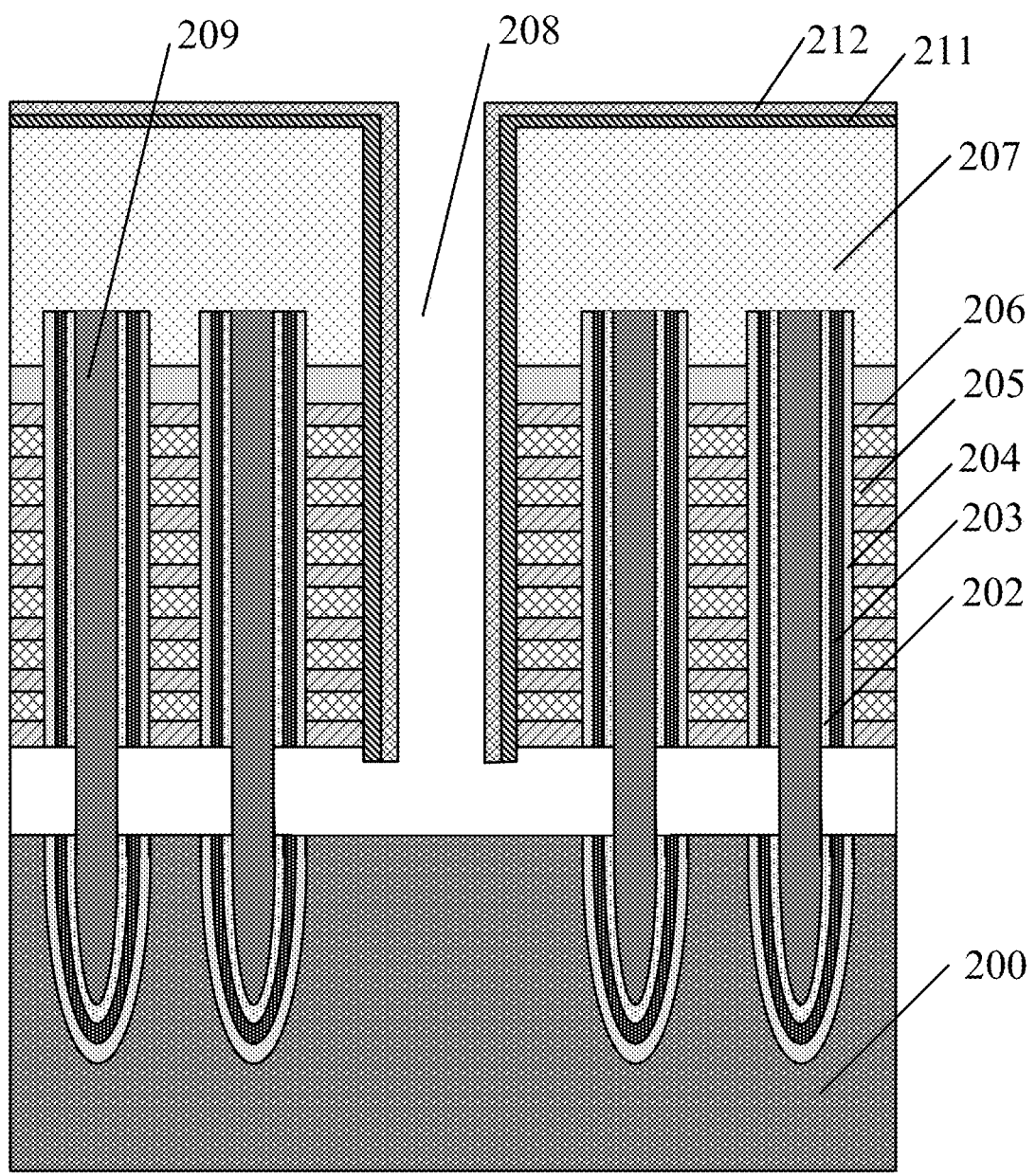

Further, referring to FIG. 3, the portion of the electron trapping layer and the tunneling layer exposed after removing the portion of the blocking layer may be removed, and the third protective layer may also be removed (S508). FIG. 11 illustrates a schematic cross-sectional view of a semiconductor structure consistent with various embodiments of the present disclosure.

Referring to FIG. 11, a portion of the electron trapping layer 203 and the tunneling layer 202 exposed after removing the portion of the blocking layer 204 may be removed, and the third protective layer 213 (referring to FIG. 10) may also be removed. In one embodiment, the third protective layer 213 may be removed during the process of removing the exposed portion of the electron trapping layer 203 and the tunneling layer 202.

In one embodiment, the exposed portion of the electron trapping layer 203 and the tunneling layer 202 as well as the third protective layer 213 may be removed by an etching process using phosphoric acid as an etchant. In addition, when the first stop layer 210a and the second stop layer 210b are made of silicon nitride, the first stop layer 210a and the second stop layer 210b may also be removed when removing the electron trapping layer 203, the tunneling layer 202, and the third protective layer 213.

It should be noted that, after removing the third protective layer 213, the second protective layer 212 may be exposed, and in a subsequent process of SEG, silicon may not be able to grow on the exposed surface of the second protective layer 212.

Figure 12:
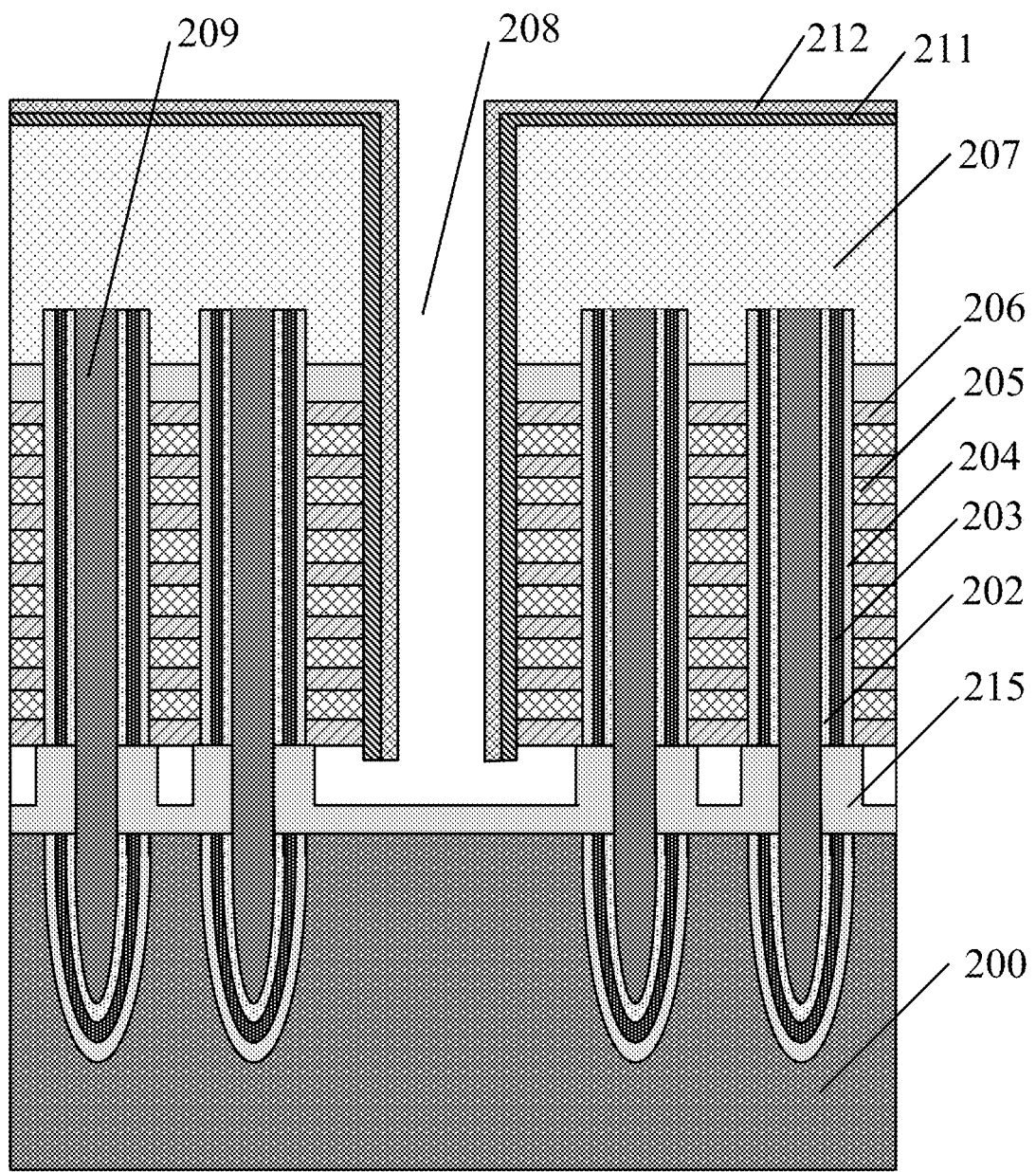

Further, returning to FIG. 3, an epitaxial layer may be formed on the exposed surface of the base substrate and the channel through sidewall selective epitaxial growth (S509). FIG. 12 illustrates a schematic cross-sectional view of a semiconductor structure consistent with various embodiments of the present disclosure.

Referring to FIG. 12, through sidewall SEG, an epitaxial layer 215 may be grown on the exposed surface of the base substrate 200 and the channel 209. In one embodiment, the epitaxial layer 215 may be made of silicon. Because the sidewall surface of the gate-line trench 208 is covered by the second protective layer 212, which is made of silicon oxide, the epitaxial layer 215 may not be formed on the sidewall surface of the gate-line trench 208. As such, forming silicon defects on the plurality of sacrificial layers 205 may be prevented, which is conducive to improving the performance of the semiconductor device.

Figure 13:
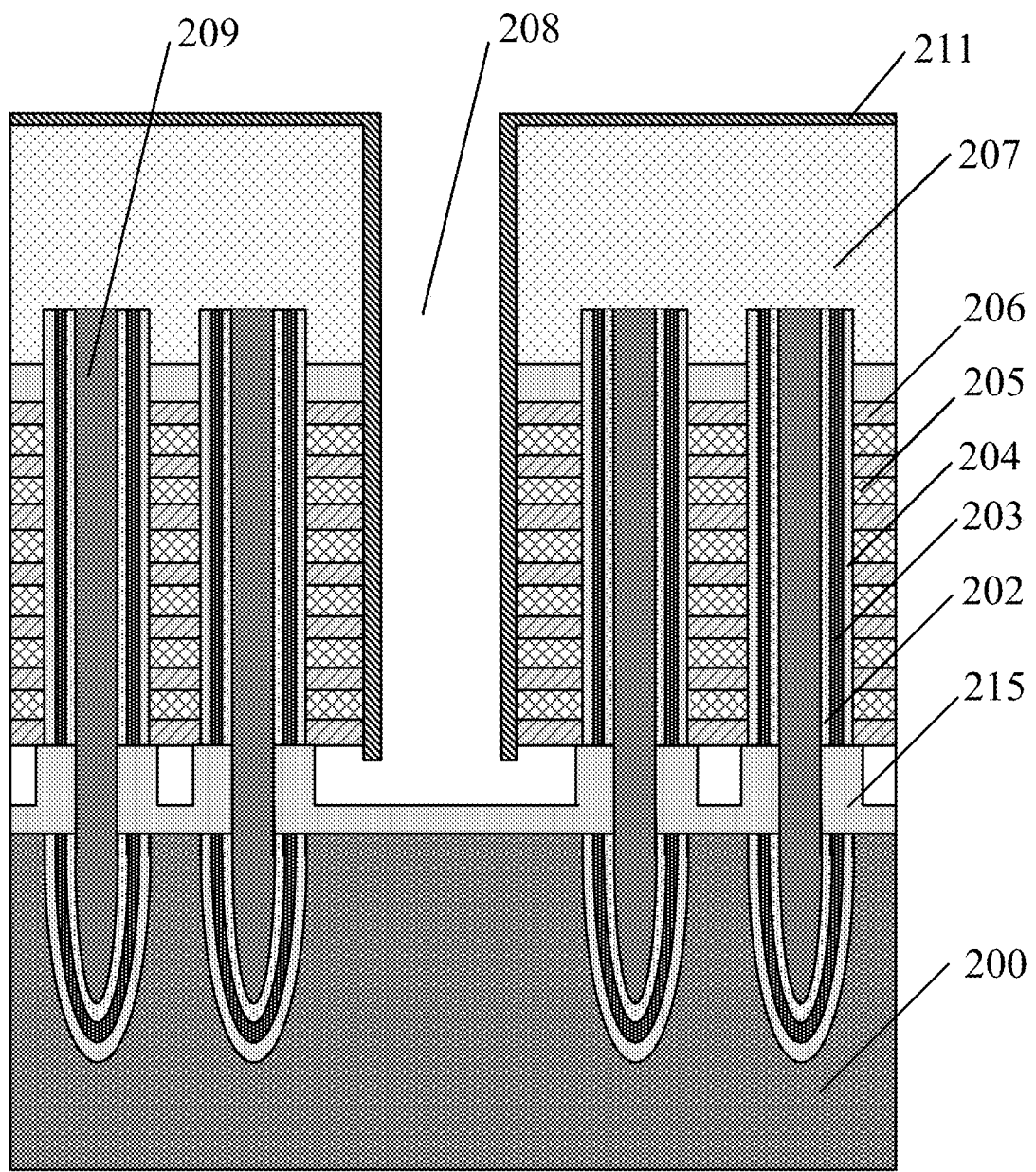

Further, returning to FIG. 3, the second protective layer may be removed (S510). FIG. 13 illustrates a schematic cross-sectional view of a semiconductor structure consistent with various embodiments of the present disclosure.

Referring to FIG. 13, the second protective layer 212 (referring to FIG. 12) may be removed. In one embodiment, the second protective layer 212 may be made of silicon oxide, and correspondingly, the second protective layer 212 may be removed by a BOE process using diluted hydrofluoric acid as an etchant. It should be noted that during the BOE process, the etching rate on silicon oxide may be substantially larger than the etching rate on silicon nitride. Therefore, when the first protective layer 211 is made of silicon nitride, the plurality of interlayer dielectric layer 206 and the gate-line capping layer 207 may be prevent from being damaged due to the presence of the first protective layer 211.

Figure 14:
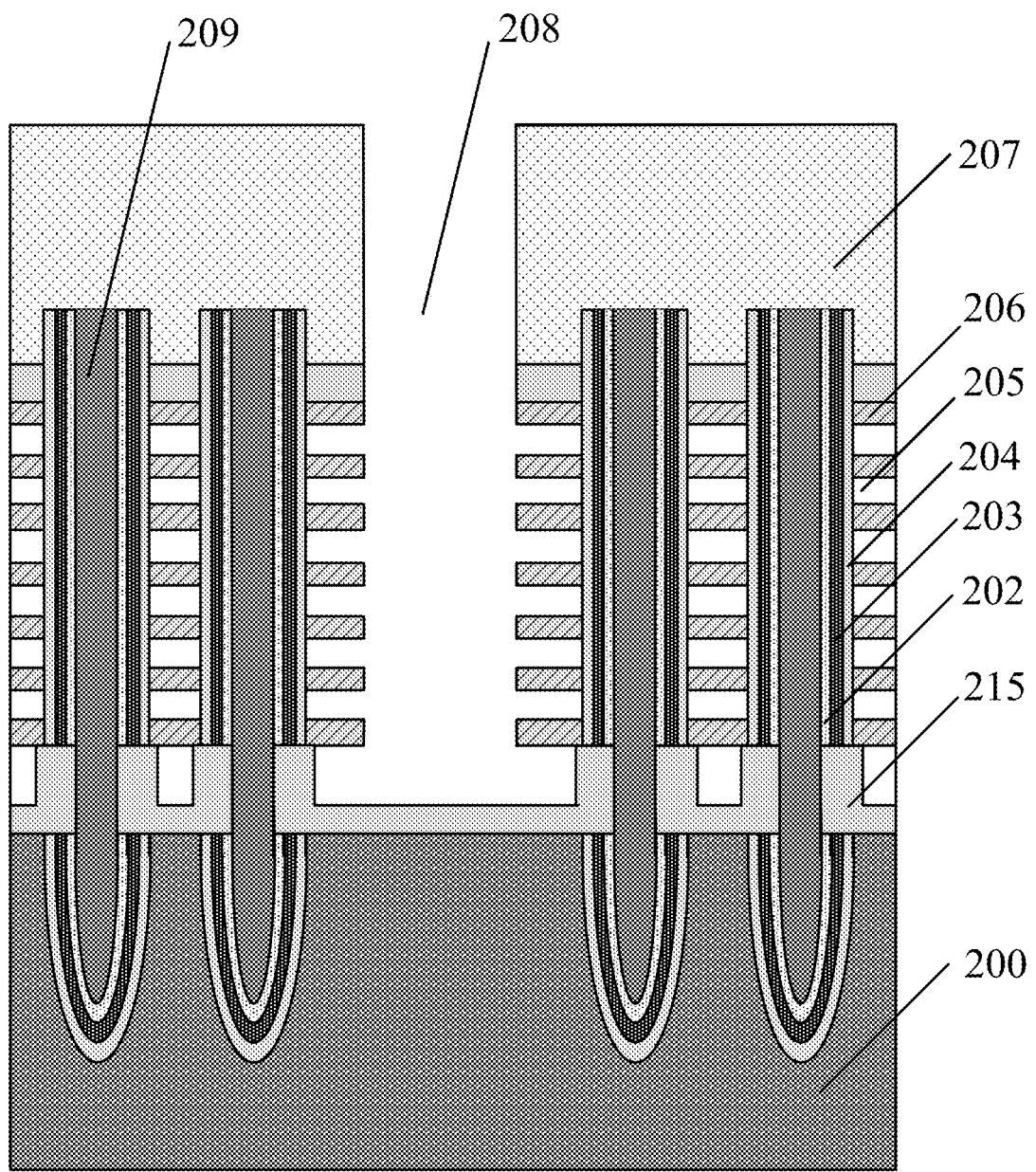

Further, returning to FIG. 3, the first protective layer and the plurality of sacrificial layers may be removed (S511). FIG. 14 illustrates a schematic cross-sectional view of a semiconductor structure consistent with various embodiments of the present disclosure.

Referring to FIG. 14, after removing the second protective layer 212 (referring to FIG. 12), the first protective layer 211 (referring to FIG. 13) and the plurality of sacrificial layers 205 (referring to FIG. 13) may be removed. In one embodiment, the first protective layer 211 and the plurality of sacrificial layers 205 may be made of silicon nitride, and correspondingly, the first protective layer 211 and the plurality of sacrificial layers 205 may be removed by an etching process using phosphoric acid as an etchant.

In one embodiment, the fabrication method may further include forming a plurality of metal gate layers (not shown) in the empty spaces formed after removing the plurality of sacrificial layers 205.

According to the disclosed fabrication method, a nitride-oxide-nitride (NON) structure is formed on the sidewall surface of the gate-line trench prior to removing a portion of the oxide-nitride-oxide (ONO) structure located at the lower end of each channel. As such, when removing the portion of the ONO structure, the NON structure may be able to provide protection for the NO stack structure. Therefore, during the removal of the first sacrificial layer and the portion of the ONO structure located at the lower end of each channel, damages to the NO stack structure and the gate-line capping layer may be prevented and the dimension of the gate-line trench may not be increased. In addition, during a subsequent sidewall SEG process, silicon defects may not be formed on the surface of the plurality of sacrificial layer. Therefore, the disclosed method may be able to improve the performance of the formed 3D NAND flash memory.

Figure 15:
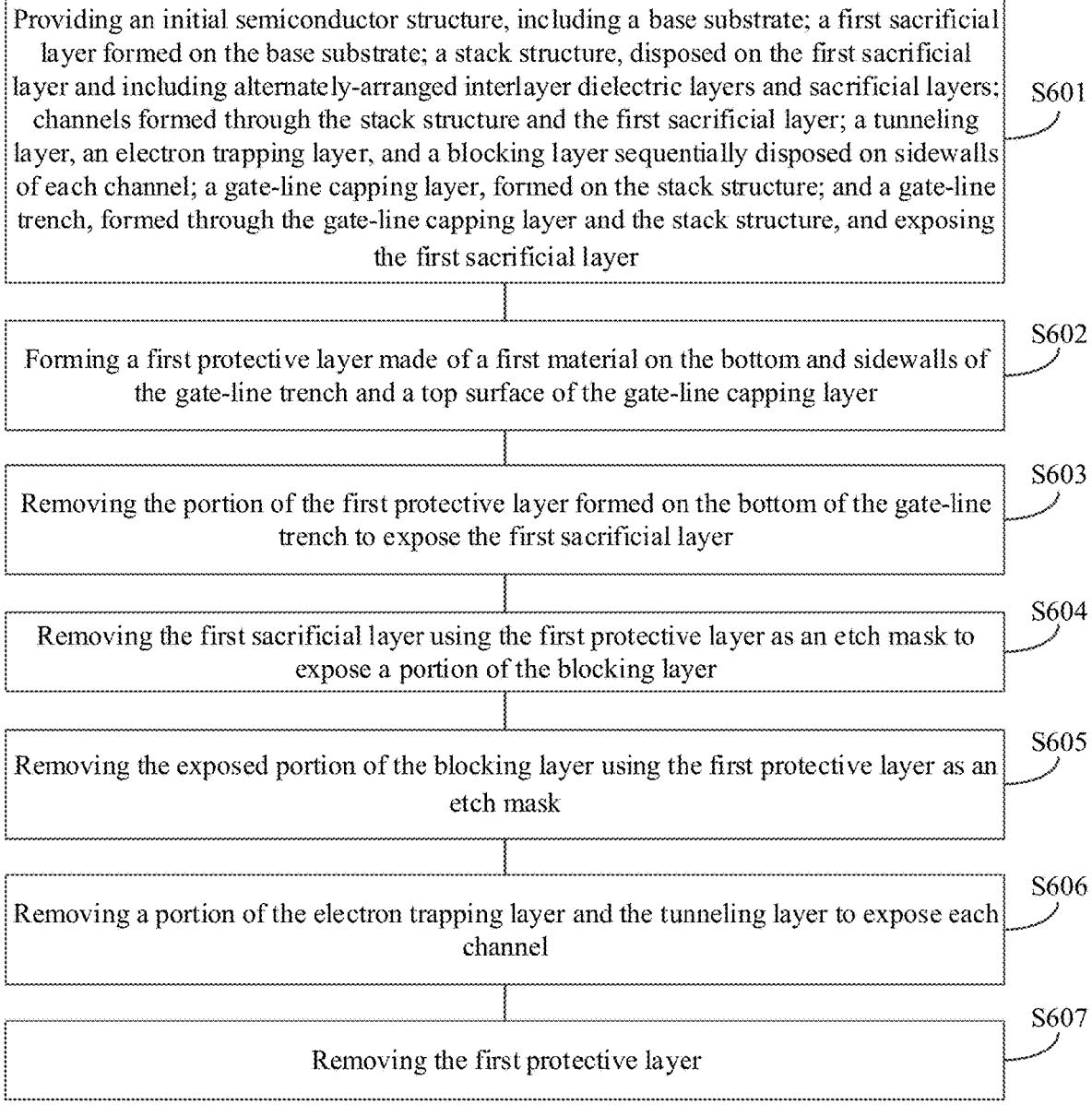
FIG. 15 illustrates a flowchart of another exemplary method for forming a memory device according to various embodiments of the present disclosure.

The present disclosure also provides another method for forming a memory device. FIG. 15 illustrates a flowchart of an exemplary method according to various embodiments of the present disclosure, and FIGS. 16-22 illustrate schematic views of semiconductor structures at certain stages of the exemplary method.

Figure 16:
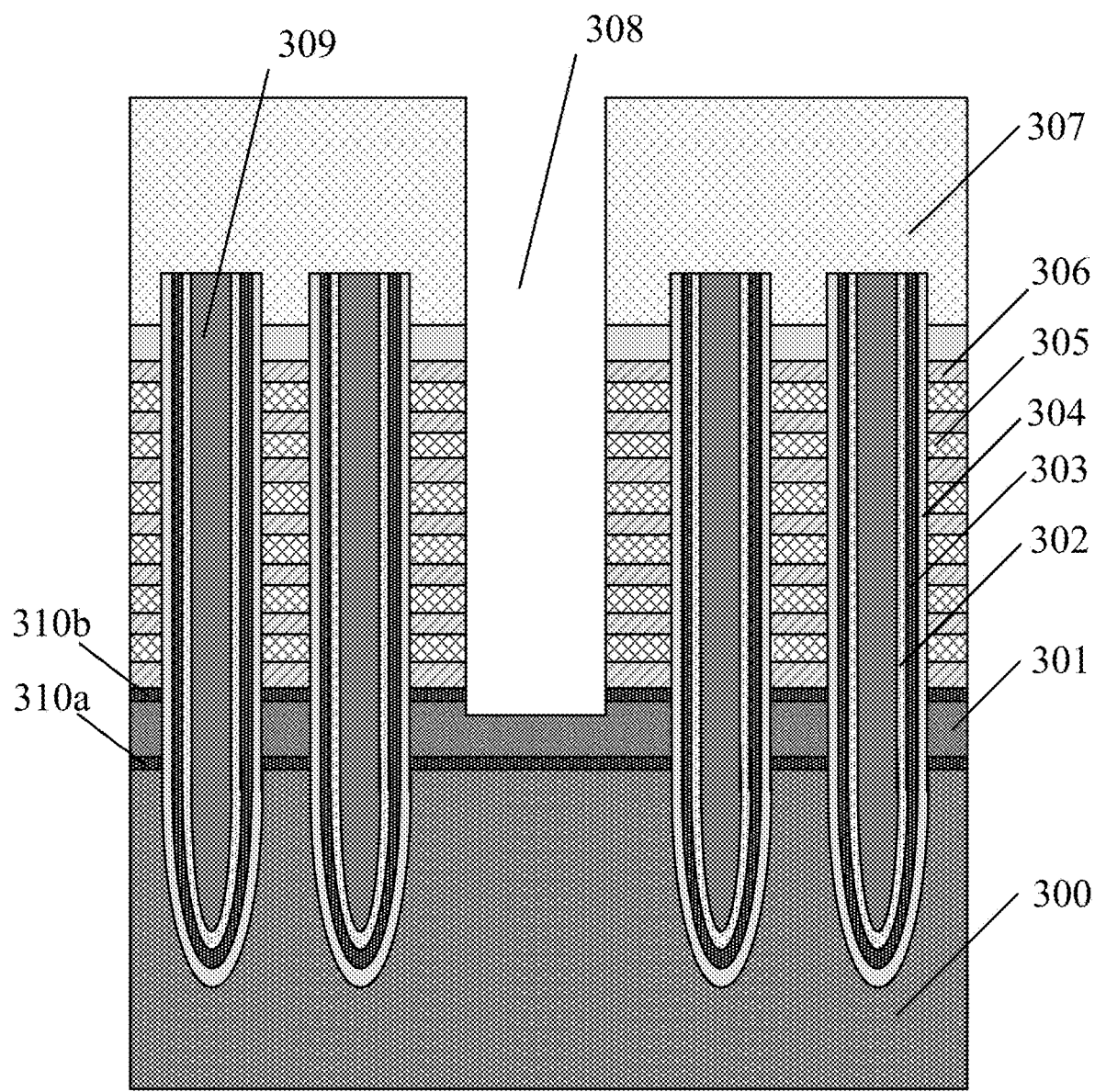
FIGS. 16-22 illustrate schematic views of semiconductor structures at certain stages of an exemplary method for forming a memory device according to various embodiments of the present disclosure.

Referring to FIG. 15, an initial semiconductor structure may be provided, and the initial semiconductor structure may include a base substrate; a first sacrificial layer formed on the base substrate; a stack structure, disposed on the first sacrificial layer and including a plurality of interlayer dielectric layers and a plurality of sacrificial layers that are alternately arranged; a plurality of channels formed through the stack structure and the first sacrificial layer; a tunneling layer, an electron trapping layer, and a blocking layer sequentially disposed on the sidewall surface of each channel to separate the channel from the stack structure and the first sacrificial layer; and a gate-line trench formed through the stack structure to expose the first sacrificial layer (S601). FIG. 16 illustrates a schematic cross-sectional view of a semiconductor structure consistent with various embodiments of the present disclosure.

Referring to FIG. 16, an initial semiconductor structure may be provided. The initial semiconductor structure may include a base substrate 300, and a first sacrificial layer 301 formed on the base substrate 300. The base substrate 300 may be made of silicon, germanium, silicon germanium, or any appropriate semiconductor material. The first sacrificial layer 301 may be made of polycrystalline silicon.

In one embodiment, the initial semiconductor structure may also include a first stop layer 310a formed between the base substrate 300 and the first sacrificial layer 301, and a second stop layer 310b formed on the first sacrificial layer 301. The first stop layer 310a and the second stop layer 310b may be made of silicon oxide, silicon nitride, or any other appropriate material. Moreover, the first stop layer 310a and the second stop layer 310b may serve as stop layers during a subsequent process of removing the first sacrificial layer 301.

Further, the initial semiconductor structure may include a stack structure formed on the first sacrificial layer 301. The stack structure may include a plurality of interlayer dielectric layers 306 and a plurality of sacrificial layers 305 that are alternately arranged. The plurality of sacrificial layers 305 may be made of a nitride, e.g. silicon nitride, and the plurality of interlayer dielectric layers 306 may be made of an oxide, e.g. silicon oxide. Therefore, the stack structure may be a NO stack structure.

In one embodiment, the initial semiconductor structure may include a plurality of channels 309 formed through the NO stack structure and the first sacrificial layer 301. Further, the initial semiconductor structure may include a tunneling layer 302, an electron trapping layer 303, and a blocking layer 304 sequentially disposed on the sidewall surface of each channel 309 to separate the channel 309 from the NO stack structure and the first sacrificial layer 301. The channel 309 may be made of polycrystalline silicon, the tunneling layer 302 may be made of an oxide, e.g. silicon oxynitride, the electron trapping layer 303 may be made of a nitride, e.g. silicon nitride, and the blocking layer 304 may be made of an oxide, e.g. silicon oxide. That is, an ONO structure may be formed on the sidewall surface of each channel 309.

Referring to FIG. 16, the initial semiconductor structure may include a gate-line trench 308 formed through the NO stack structure to expose the first sacrificial layer 301. That is, the bottom surface of the gate-line trench 308 may be formed in the first sacrificial layer 301. In one embodiment, when the second stop layer 310b is formed on the first sacrificial layer 301, the gate-line trench 308 may penetrate the second stop layer 310b to expose the first sacrificial layer 301.

In one embodiment, the initial semiconductor structure may include a gate-line capping layer 307 formed on the top surface of the NO stack structure. The gate-line capping layer 307 may be made of an oxide, e.g. silicon oxide, and may cover the plurality of channels 309. Correspondingly, the gate-line trench 308 may also penetrate the gate-line capping layer 307.

Figure 17:
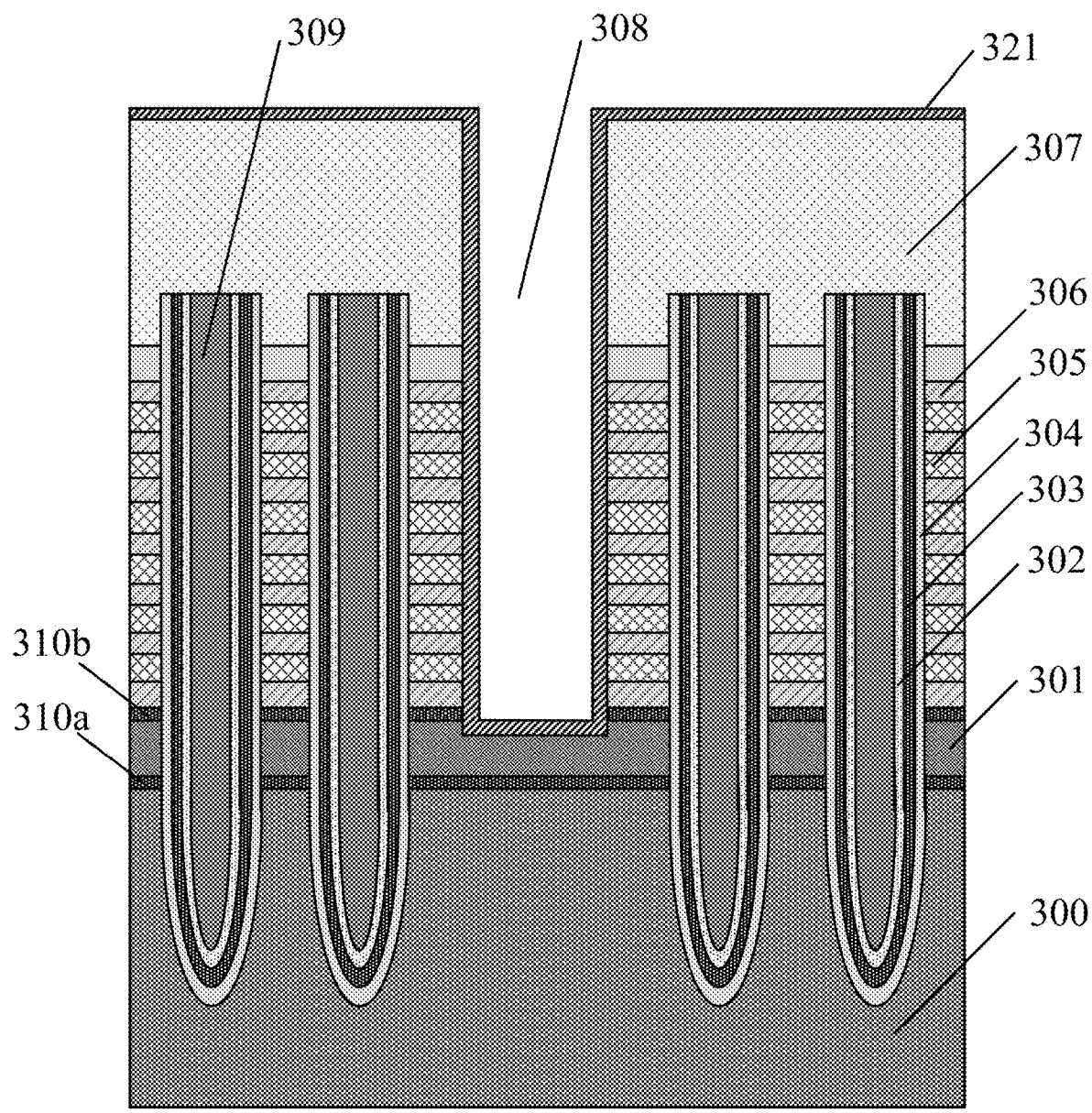

Further, returning to FIG. 15, a first protective layer made of a first material may be formed on the bottom and sidewall surfaces of the gate-line trench (S602). FIG. 17 illustrates a schematic cross-sectional view of a semiconductor structure consistent with various embodiments of the present disclosure.

Referring to FIG. 17, a first protective layer 321 may be formed to cover the bottom and sidewall surfaces of the gate-line trench 308. The first protective layer 321 may also cover the surface of the gate-line capping layer 307. In one embodiment, the first protective layer 321 may be made of a first material. The first material may include titanium nitride. The first protective layer 321 may be formed by an ALD process, a CVD process, or other appropriate deposition process.

The thickness of the first protective layer 321 may not be too small or too large. When the thickness of the first protective layer 321 is too small, the first protective layer 321 may not be able to provide sufficient protection for the NO stack structure and the gate-line capping layer 307 in subsequent fabrication processes. However, when the thickness of the first protective layer 321 is too large, the subsequent removal of the first sacrificial layer 301 may become difficult. In addition, an overly large thickness may also make the first protective layer 321 difficult to be removed in a subsequent process. Therefore, in one embodiment, the thickness of the first protective layer 321 may be in a range of approximately 10 nm to 40 nm.

Figure 18:
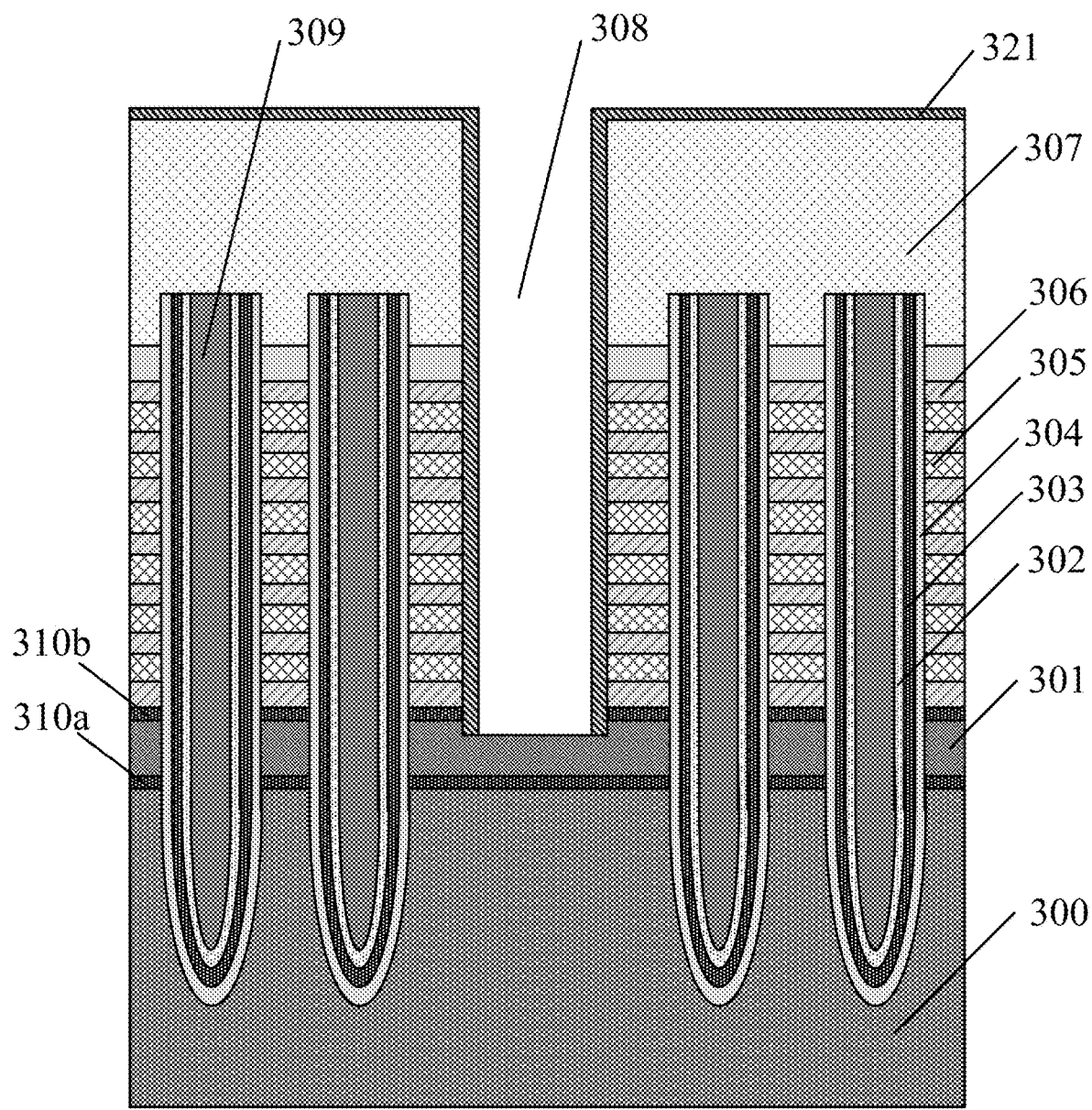

Further, returning to FIG. 15, the portion of the first protective layer formed on the bottom of the gate-line trench may be removed to expose the first sacrificial layer (S603). FIG. 18 illustrates a schematic cross-sectional view of a semiconductor structure consistent with various embodiments of the present disclosure.

Referring to FIG. 18, the portion of the first protective layer 321 formed on the bottom of the gate-line trench 308 may be removed to expose the first sacrificial layer 301. In one embodiment, the portion of the first protective layer 321 formed on the bottom of the gate-line trench 308 may be removed by a dry etching process.

Figure 19:
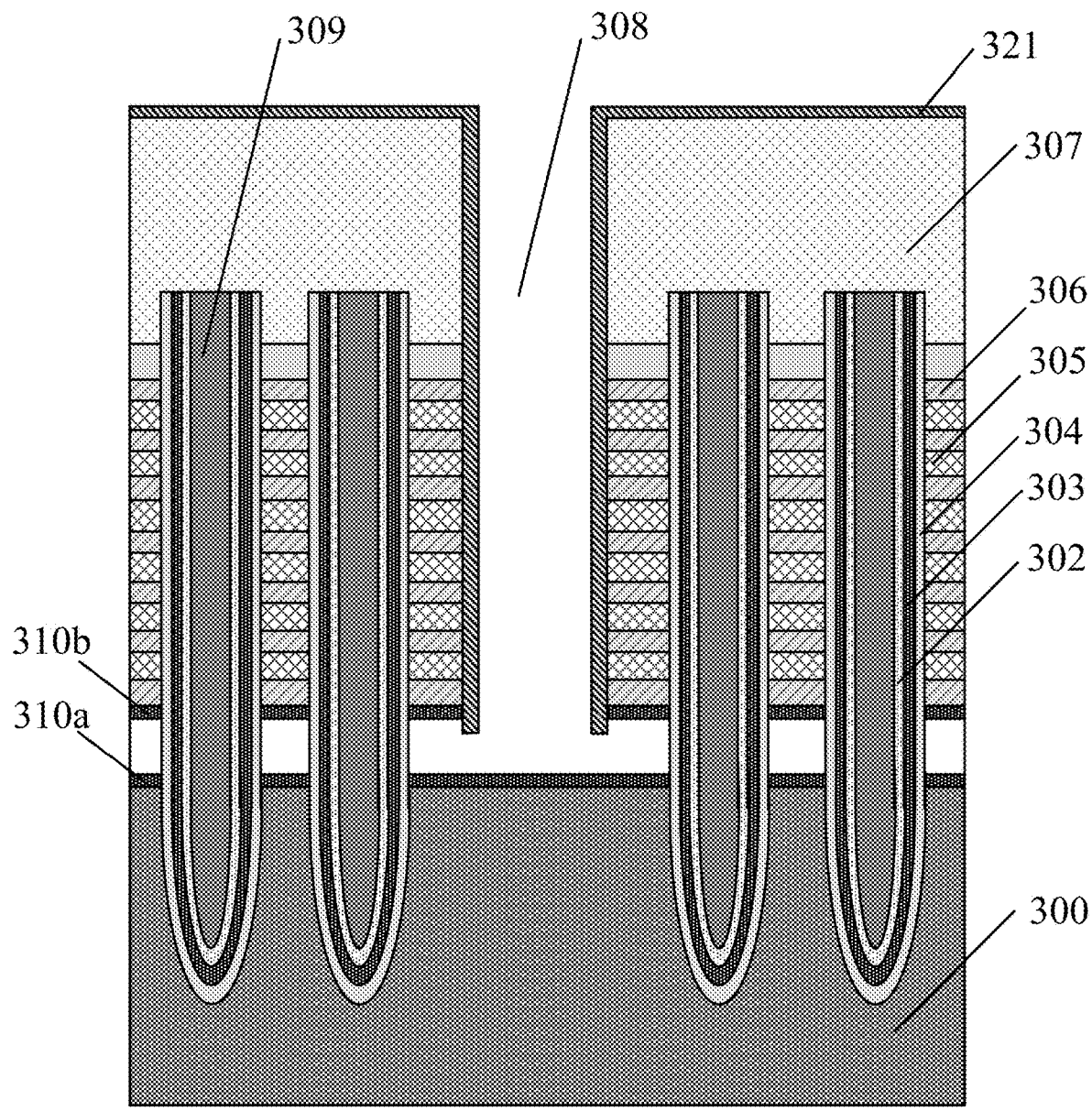

Further, returning to FIG. 15, the first sacrificial layer may be removed using the first protective layer as an etch mask to expose a portion of the blocking layer (S604). FIG. 19 illustrates a schematic cross-sectional view of a semiconductor structure consistent with various embodiments of the present disclosure.

Referring to FIG. 19, the first sacrificial layer 301 may be removed using the first protective layer 321 as an etch mask. In one embodiment, because the first sacrificial layer 301 is made of titanium nitride, the first sacrificial layer 301 may be removed by a highly selective etching process which is capable of removing polycrystalline silicon while having limited etching effect on titanium nitride. In one embodiment, the first sacrificial layer 301 may be removed by a dry etching process. For example, a chlorine-containing gas, or any other appropriate gas having a high etching ratio on polycrystalline silicon and a low etching ratio on titanium nitride may be used as an etching gas for the removal of the first sacrificial layer 301.

It should be noted that, after removing the first sacrificial layer 301, a portion of the blocking layer 304 formed on each channel 309 may be exposed.

Figure 20:
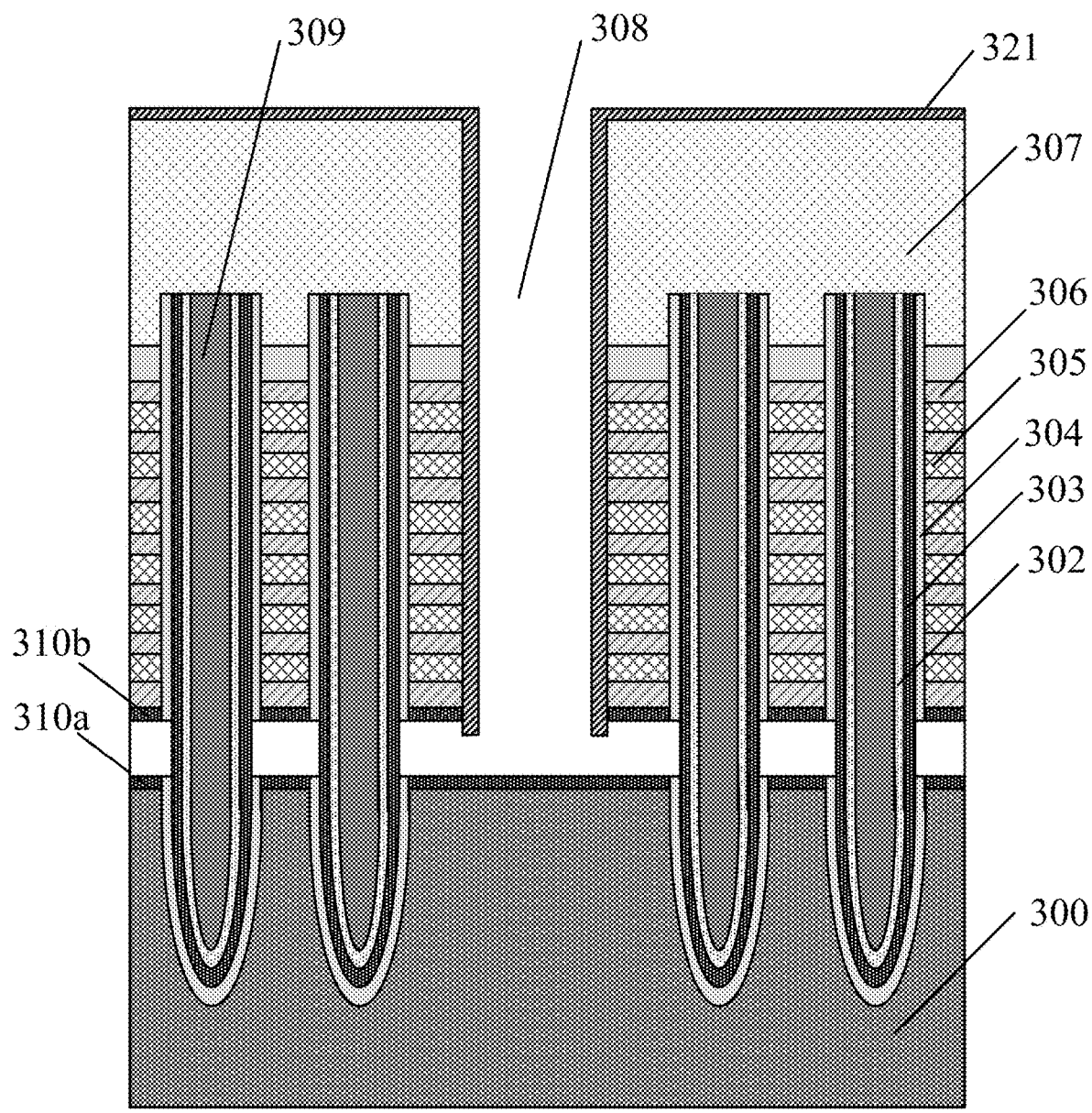

Further, returning to FIG. 15, the exposed portion of the blocking layer may be removed using the first protective layer as an etch mask (S605). FIG. 20 illustrates a schematic cross-sectional view of a semiconductor structure consistent with various embodiments of the present disclosure.

Referring to FIG. 20, the exposed portion of the blocking layer 304 may be removed using the first protective layer 321 as an etch mask, such that the electron trapping layer 303 may be partially exposed. In one embodiment, the portion of the blocking layer 304 exposed after removing the first sacrificial layer 301 (referring to FIG. 18) may be exposed by a wet etching process. For example, a BOE process using diluted hydrofluoric acid as an etchant may be adopted to remove the blocking layer 304. Because the diluted hydrofluoric acid demonstrates a substantially higher etching ratio on silicon oxide than on titanium nitride and silicon nitride, during the removal of the blocking layer 304, the first protective layer 321 may not be removed.

In one embodiment, the first stop layer 310a and the second stop layer 310b are made of silicon nitride, and correspondingly, when removing the blocking layer 304, the first stop layer 310a and the second stop layer 310b may not be removed. In other embodiments, the first stop layer 310a and the second stop layer 310b are made of silicon oxide, and thus the first stop layer 310a and the second stop layer 310b may be removed when removing the blocking layer 304.

Figure 21:
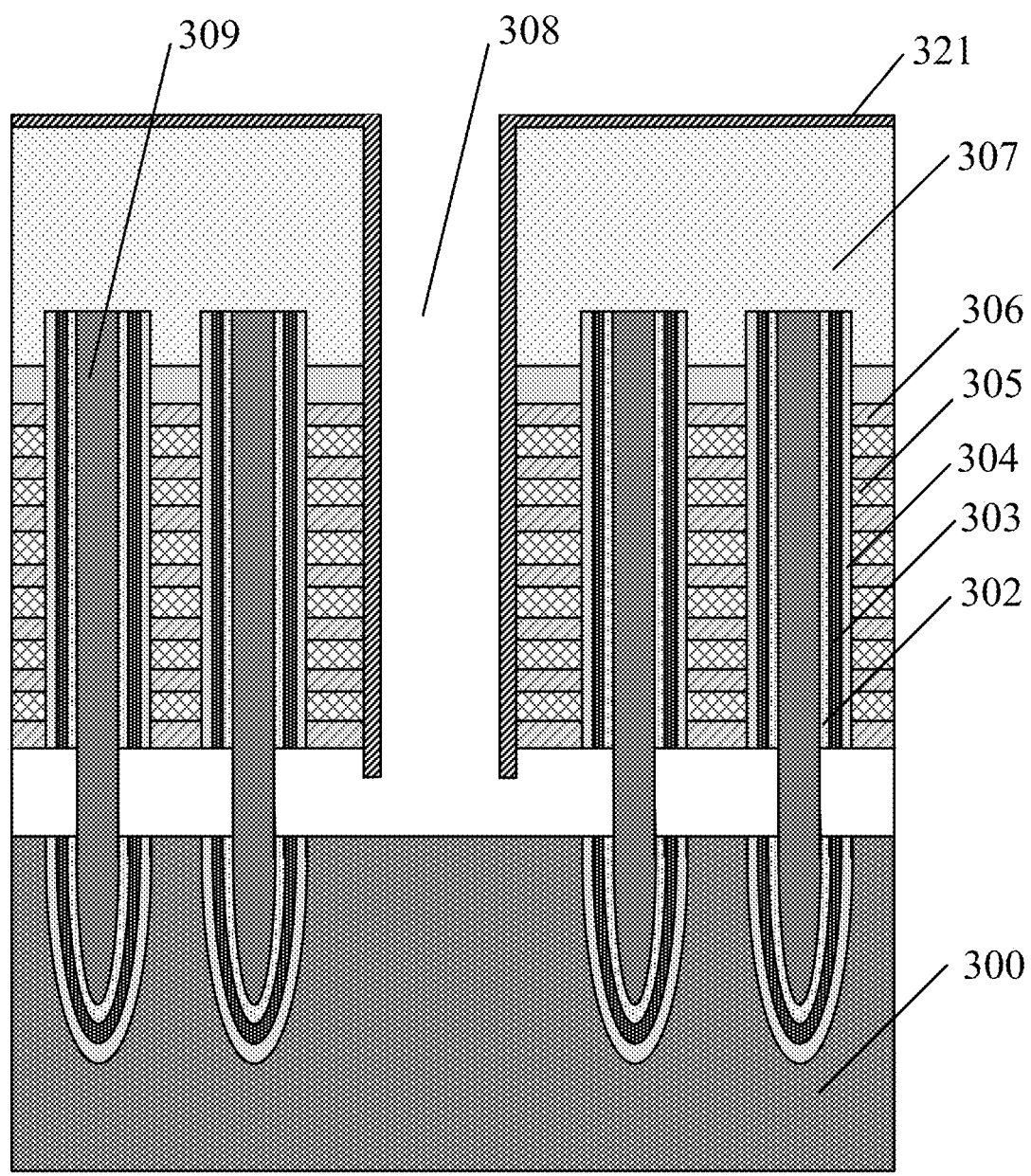

Further, returning to FIG. 15, the portion of the electron trapping layer and the tunneling layer exposed after removing the portion of the blocking layer may be removed (S606). FIG. 21 illustrates a schematic cross-sectional view of a semiconductor structure consistent with various embodiments of the present disclosure.

Referring to FIG. 21, a portion of the electron trapping layer 303 and the tunneling layer 302 exposed after removing the portion of the blocking layer 304 may be removed. In one embodiment, the electron trapping layer 303 and the tunneling layer 302 may be removed by an etching process using phosphoric acid as an etchant. In addition, when the first stop layer 310a and the second stop layer 310b are made of silicon nitride, the first stop layer 310a and the second stop layer 310b may also be removed when removing the electron trapping layer 303 and the tunneling layer 302.

Figure 22:
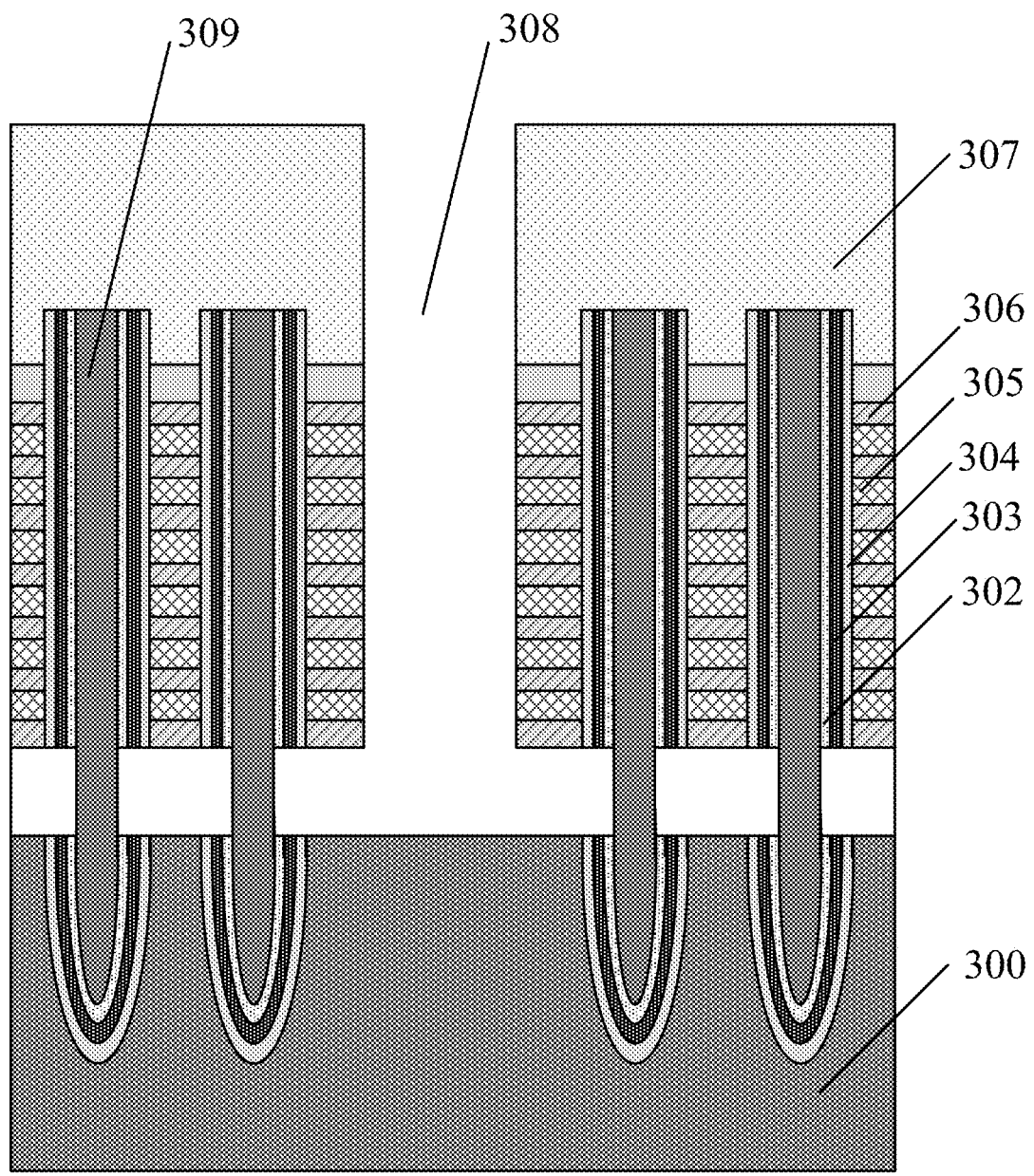

Further, returning to FIG. 15, the first protective layer may be removed (S607). FIG. 22 illustrates a schematic cross-sectional view of a semiconductor structure consistent with various embodiments of the present disclosure.

Referring to FIG. 22, after removing the electron trapping layer 303 and the tunneling layer 302 (referring to FIG. 20), the first protective layer 321 may be removed. In one embodiment, the first protective layer 321 may be removed by a dry etching process.

In some embodiments, after removing the first protective layer 321, a sidewall SEG process may be performed to form an epitaxial layer on the exposed surfaces of the base substrate and the channel 309; the plurality of sacrificial layers may be removed, and a plurality of metal gate layers may be formed in the empty space formed after removing the plurality of sacrificial layers. For the details of the sidewall SEG process, the removal of the sacrificial layers, and the formation of the metal gate layers, reference may be made to the corresponding description in various embodiments provided above.

According to the disclosed fabrication method, a titanium nitride layer is formed on the sidewall surface of the gate-line trench prior to removing a portion of the oxide-nitride-oxide (ONO) structure located at the lower end of each channel. As such, when removing the portion of the ONO structure, the titanium nitride layer may be able to provide protection for the NO stack structure. Therefore, during the removal of the first sacrificial layer and the portion of the ONO structure located at the lower end of each channel, damages to the NO stack structure and the gate-line capping layer may be prevented and the dimension of the gate-line trench may not be increased. Therefore, the disclosed method may be able to improve the performance of the formed 3D NAND flash memory.

Figure 23:
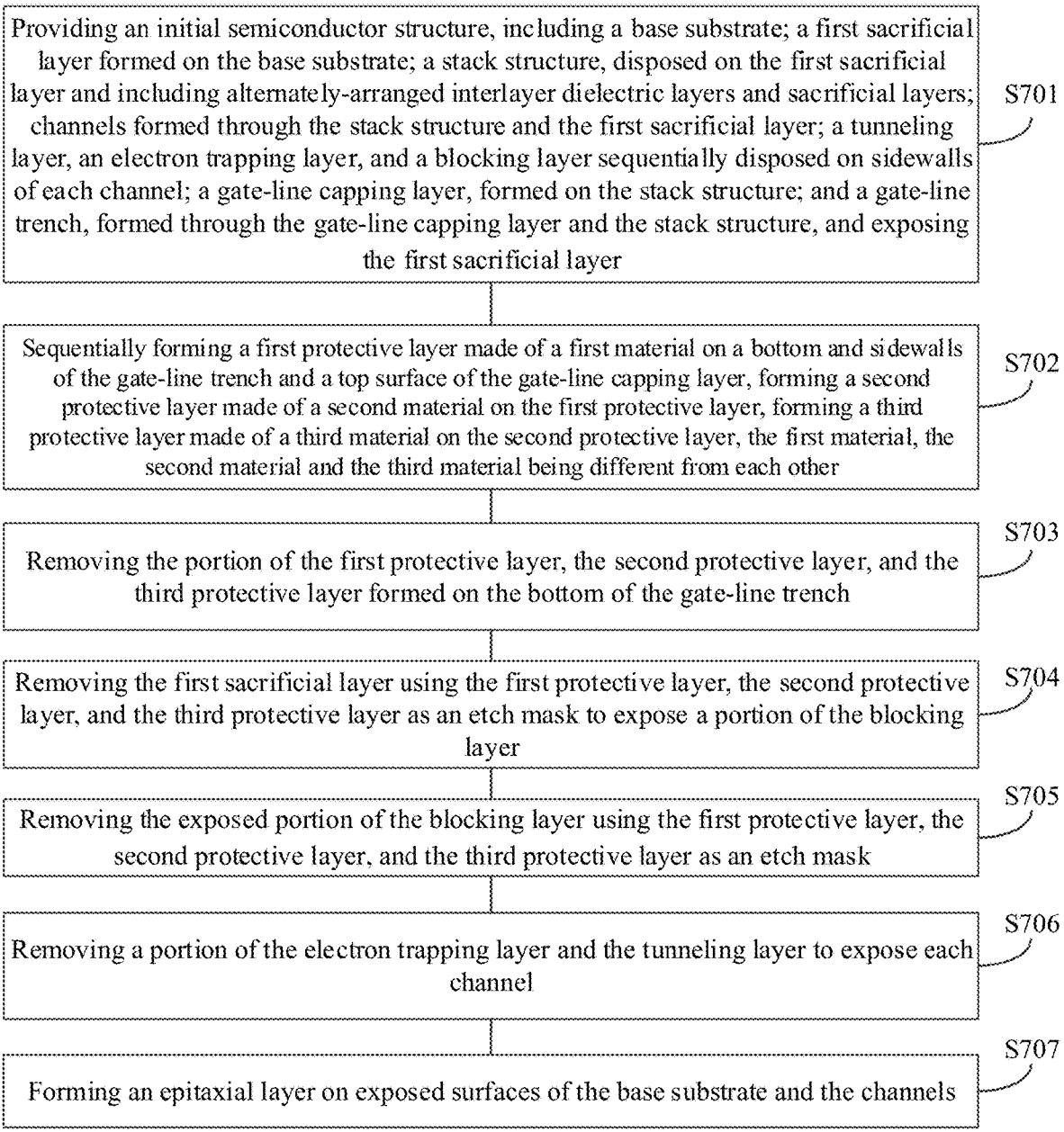
FIG. 23 illustrates a flowchart of another exemplary method for forming a memory device according to various embodiments of the present disclosure.

The present disclosure also provides another method for forming a memory device. FIG. 23 illustrates a flowchart of an exemplary method according to various embodiments of the present disclosure, and FIGS. 24-30 illustrate schematic views of semiconductor structures at certain stages of the exemplary method.

Figure 24:
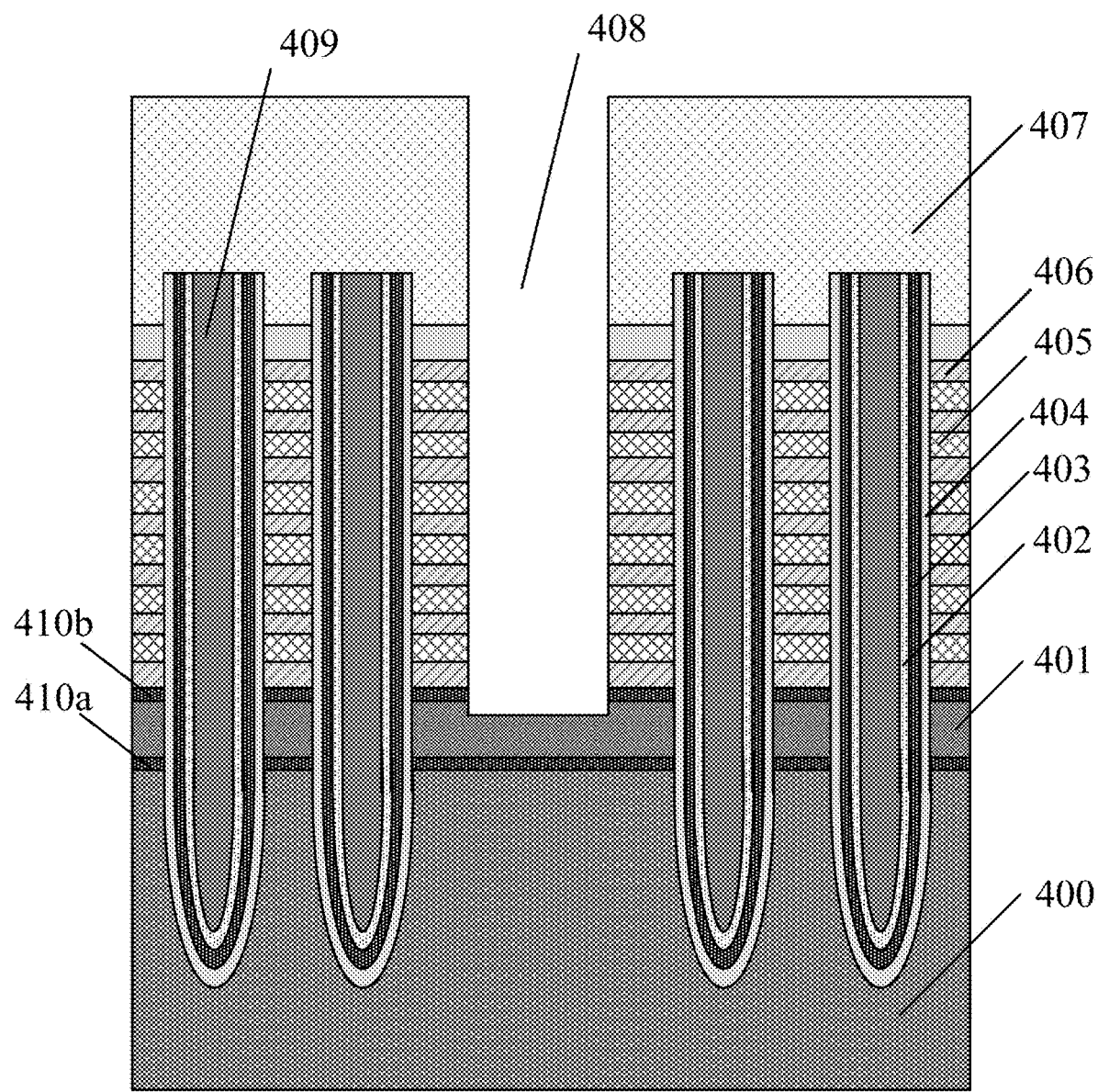
FIGS. 24-30 illustrate schematic views of semiconductor structures at certain stages of an exemplary method for forming a memory device according to various embodiments of the present disclosure.

Referring to FIG. 23, an initial semiconductor structure may be provided, and the initial semiconductor structure may include a base substrate; a first sacrificial layer formed on the base substrate; a stack structure, disposed on the first sacrificial layer and including a plurality of interlayer dielectric layers and a plurality of sacrificial layers that are alternately arranged; a plurality of channels formed through the stack structure and the first sacrificial layer; a tunneling layer, an electron trapping layer, and a blocking layer sequentially disposed on the sidewall surface of each channel to separate the channel from the stack structure and the first sacrificial layer; and a gate-line trench formed through the stack structure to expose the first sacrificial layer (S701). FIG. 24 illustrates a schematic cross-sectional view of a semiconductor structure consistent with various embodiments of the present disclosure.

Referring to FIG. 24, an initial semiconductor structure may be provided. The initial semiconductor structure may include a base substrate 400, and a first sacrificial layer 401 formed on the base substrate 400. The base substrate 400 may be made of silicon, germanium, silicon germanium, or any appropriate semiconductor material. The first sacrificial layer 401 may be made of polycrystalline silicon.

In one embodiment, the initial semiconductor structure may also include a first stop layer 410a formed between the base substrate 400 and the first sacrificial layer 401, and a second stop layer 410b formed on the first sacrificial layer 401. The first stop layer 410a and the second stop layer 410b may be made of silicon oxide, silicon nitride, or any other appropriate material. Moreover, the first stop layer 410a and the second stop layer 410b may serve as stop layers during a subsequent process of removing the first sacrificial layer 401.

Further, the initial semiconductor structure may include a stack structure on the first sacrificial layer 401. The stack structure may include a plurality of interlayer dielectric layers 406 and a plurality of sacrificial layers 405 that are alternately arranged. The plurality of sacrificial layers 405 may be made of a nitride, e.g. silicon nitride, and the plurality of interlayer dielectric layers 406 may be made of an oxide, e.g. silicon oxide. Therefore, the stack structure may be a NO stack structure.

In one embodiment, the initial semiconductor structure may include a plurality of channels 409 formed through the NO stack structure and the first sacrificial layer 401. Further, the initial semiconductor structure may include a tunneling layer 402, an electron trapping layer 403, and a blocking layer 404 sequentially disposed on the sidewall surface of each channel 409 to separate the channel 409 from the NO stack structure and the first sacrificial layer 401. The channel 409 may be made of polycrystalline silicon, the tunneling layer 402 may be made of an oxide, e.g. silicon oxynitride, the electron trapping layer 403 may be made of a nitride, e.g. silicon nitride, and the blocking layer 404 may be made of an oxide, e.g. silicon oxide. That is, an ONO structure may be formed on the sidewall surface of each channel 409.

Referring to FIG. 24, the initial semiconductor structure may include a gate-line trench 408 formed through the NO stack structure to expose the first sacrificial layer 401. That is, the bottom surface of the gate-line trench 208 may be formed in the first sacrificial layer 401. In one embodiment, when the second stop layer 410b is formed on the first sacrificial layer 401, the gate-line trench 408 may penetrate the second stop layer 410b to expose the first sacrificial layer 401.

In one embodiment, the initial semiconductor structure may include a gate-line capping layer 407 formed on the top surface of the NO stack structure. The gate-line capping layer 407 may be made of an oxide, e.g. silicon oxide, and may cover the plurality of channels 409. Correspondingly, the gate-line trench 408 may also penetrate the gate-line capping layer 407.

Figure 25:
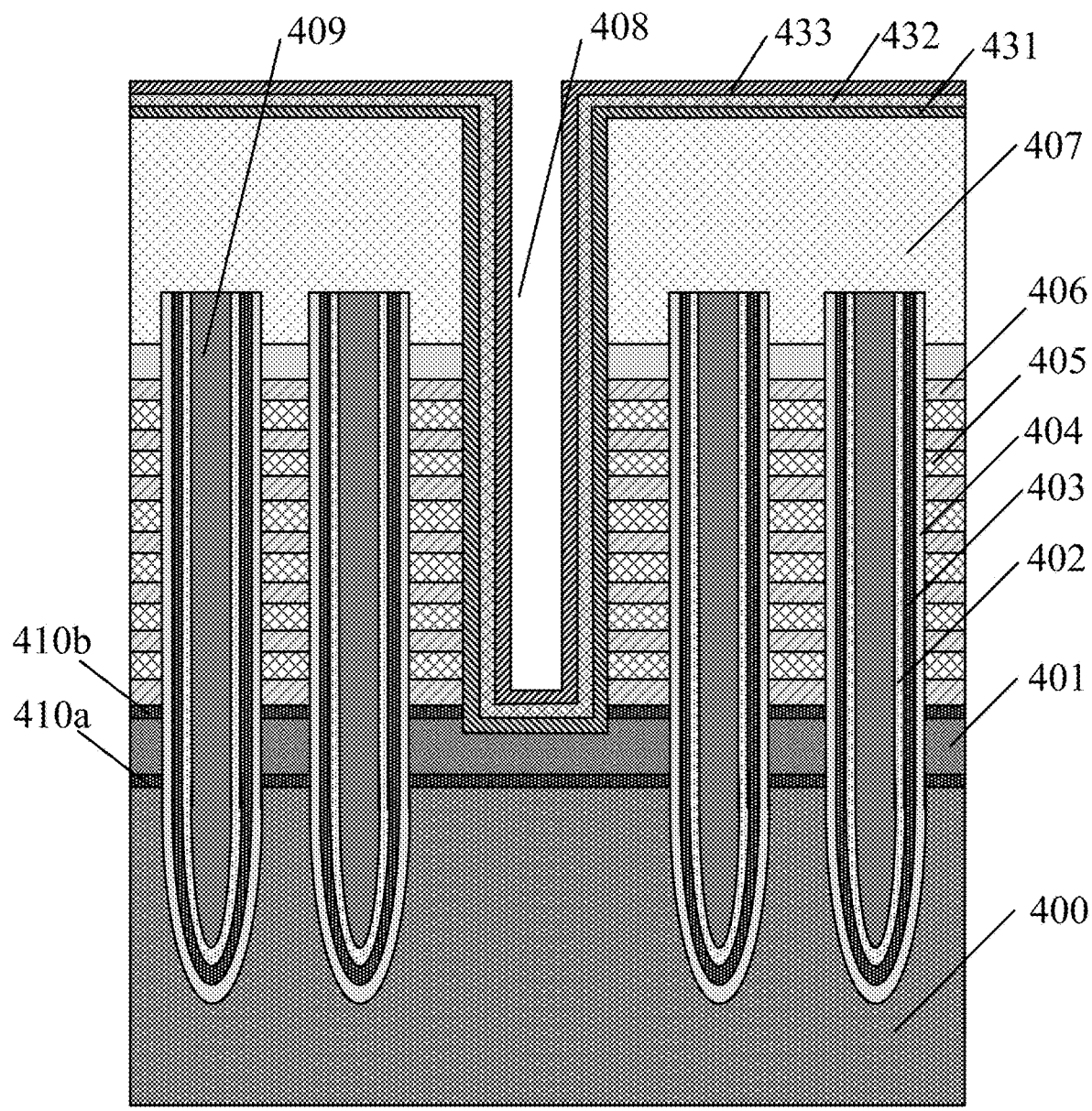

Further, returning to FIG. 23, a first protective layer made of a first material may be formed on the bottom and sidewalls of the gate-line trench, a second protective layer made of a second material may be formed on the first protective layer, and a third protective layer made of a third material may be formed on the second protective layer, the first material, the second material, and the third material being different from each other (S702). FIG. 25 illustrates a schematic cross-sectional view of a semiconductor structure consistent with various embodiments of the present disclosure.

Referring to FIG. 25, a first protective layer 431 made of a first material may be formed to cover the bottom and sidewalls of the gate-line trench 408, a second protective layer 432 made of a second material may be formed on the first protective layer 431, and a third protective layer 433 may be formed on the second protective layer 432. The first protective layer 431, the second protective layer 432, and the third protective layer 433 may also cover the surface of the gate-line capping layer 407. The first material, the second material, and the third material may be different from each other. In one embodiment, the first material may include silicon nitride, the second material may include silicon oxide, and the third material may include titanium nitride. In one embodiment, each of the first protective layer 431, the second protective layer 432, and the third protective layer 433 may be formed by an ALD process, a CVD process, or other appropriate deposition process.

The thickness of the first protective layer 431 may not be too small or too large. When the thickness of the first protective layer 431 is too small, the first protective layer 431 may not be able to provide sufficient protection for the NO stack structure and the gate-line capping layer 407 in subsequent fabrication processes. However, when the thickness of the first protective layer 431 is too large, the overall thickness of the film layers formed on the sidewall surface of the gate-line trench 408 may be too large, making the subsequent removal of the first sacrificial layer 401 difficult. In addition, an overly large thickness may also make the first protective layer 431 difficult to be removed in a subsequent process. Therefore, in one embodiment, the thickness of the first protective layer 431 may be in a range of approximately 2 nm to 5 nm.

The thickness of the second protective layer 432 may not be too small or too large. When the thickness of the second protective layer 432 is too small, the second protective layer 432 may not be able to provide sufficient protection for the first protective layer 431 in subsequent fabrication processes. However, when the thickness of the second protective layer 432 is too large, the overall thickness of the film layers formed on the sidewall surface of the gate-line trench 408 may be too large, making the subsequent removal of the first sacrificial layer 401 difficult. In addition, an overly large thickness may also make the second protective layer 432 difficult to be removed in a subsequent process. Therefore, in one embodiment, the thickness of the second protective layer 432 may be in a range of approximately 10 nm to 15 nm.

The thickness of the third protective layer 433 may not be too small or too large. When the thickness of the third protective layer 433 is too small, the third protective layer 433 may not be able to provide sufficient protection for the second protective layer 432 and the first protective layer 431 in subsequent fabrication processes. However, when the thickness of the first protective layer 433 is too large, the overall thickness of the film layers formed on the sidewall surface of the gate-line trench 408 may be too large, making the subsequent removal of the first sacrificial layer 401 difficult. In addition, an overly large thickness may also make the third protective layer 433 difficult to be removed in a subsequent process. Therefore, in one embodiment, the thickness of the third protective layer 433 may be in a range of approximately 15 nm to 30 nm.

Figure 26:
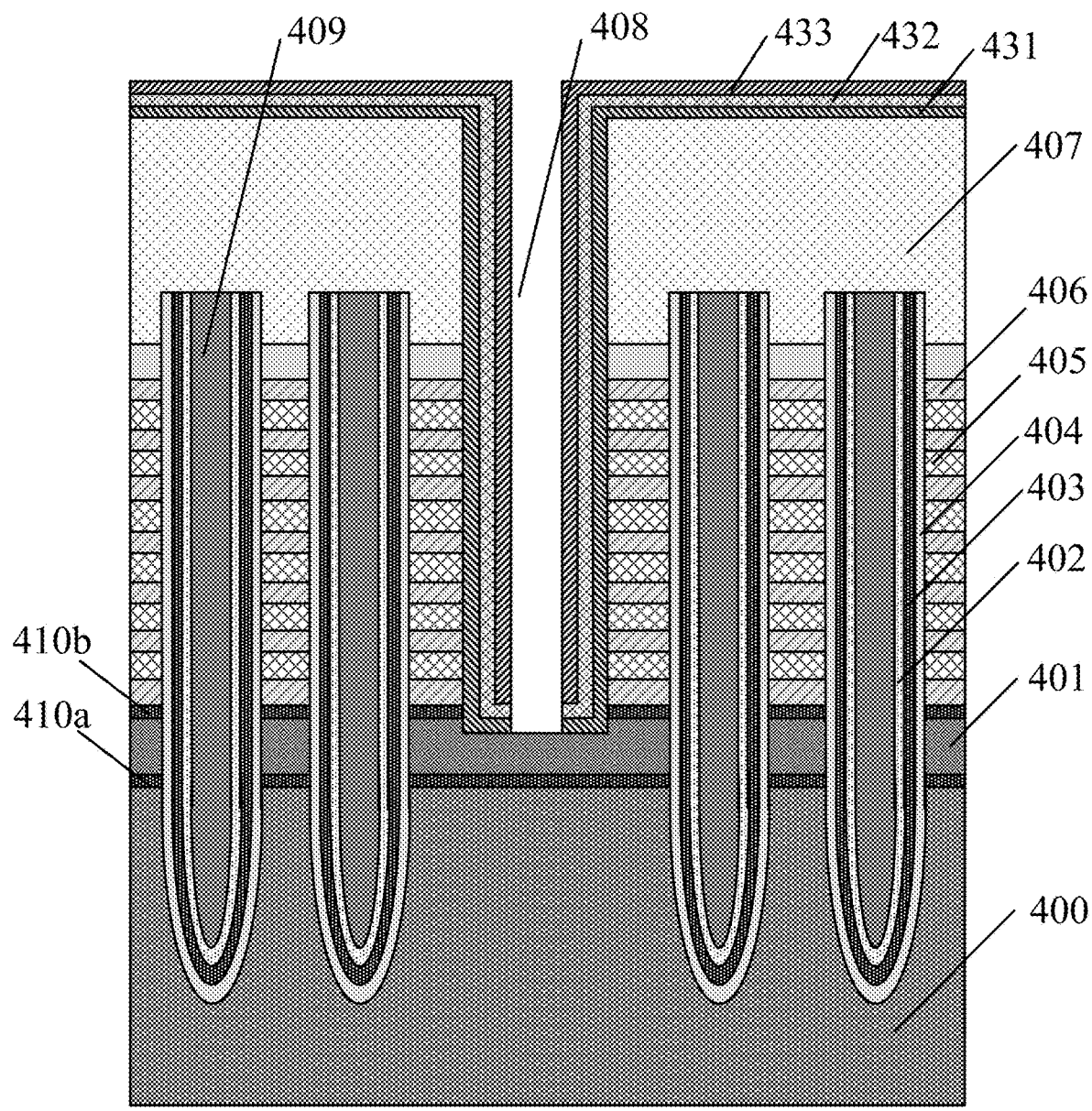

Further, returning to FIG. 23, the portion of the first protective layer, the second protective layer, and the third protective layer formed on the bottom of the gate-line trench may be removed to expose the first sacrificial layer (S703). FIG. 26 illustrates a schematic cross-sectional view of a semiconductor structure consistent with various embodiments of the present disclosure.

Referring to FIG. 26, the portion of the first protective layer 431, the second protective layer 432, and the third protective layer 433 formed on the bottom of the gate-line trench 408 may be removed to expose the first sacrificial layer 401. In one embodiment, the portion of the first protective layer 431, the second protective layer 432, and the third protective layer 433 formed on the bottom of the gate-line trench 408 may be removed by a dry etching process.

Figure 27:
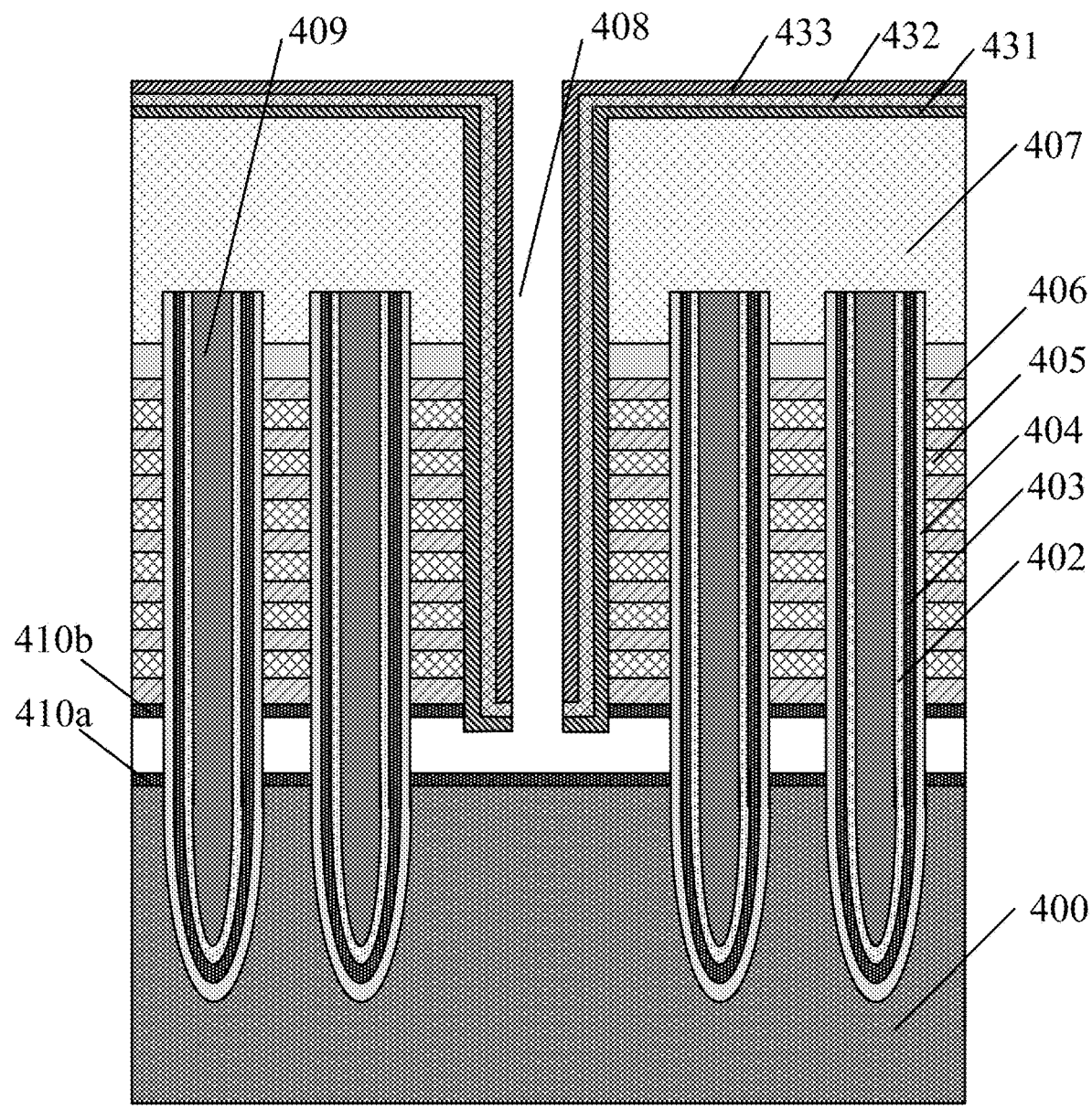

Further, referring to FIG. 23, the first sacrificial layer may be removed using the first protective layer, the second protective layer, and the third protective layer as an etch mask to expose a portion of the blocking layer (S704). FIG. 27 illustrates a schematic cross-sectional view of a semiconductor structure consistent with various embodiments of the present disclosure.

Referring to FIG. 27, the first sacrificial layer 401 may be removed using the first protective layer 431, the second protective layer 432, and the third protective layer 433 as an etch mask. In one embodiment, because the first sacrificial layer 401 is made of polycrystalline silicon, the first sacrificial layer 401 may be removed by a highly selective etching process which is capable of removing polycrystalline silicon while having limited etching effect on silicon nitride. In one embodiment, the first sacrificial layer 401 may be removed by a dry etching process. For example, a chlorine-containing gas, or any other appropriate gas having a high etching ratio on polycrystalline silicon and a low etching ratio on silicon nitride may be used as an etching gas for the removal of the first sacrificial layer 401.

It should be noted that, after removing the first sacrificial layer 401, a portion of the blocking layer 404 formed on each channel 409 may be exposed.

Figure 28:
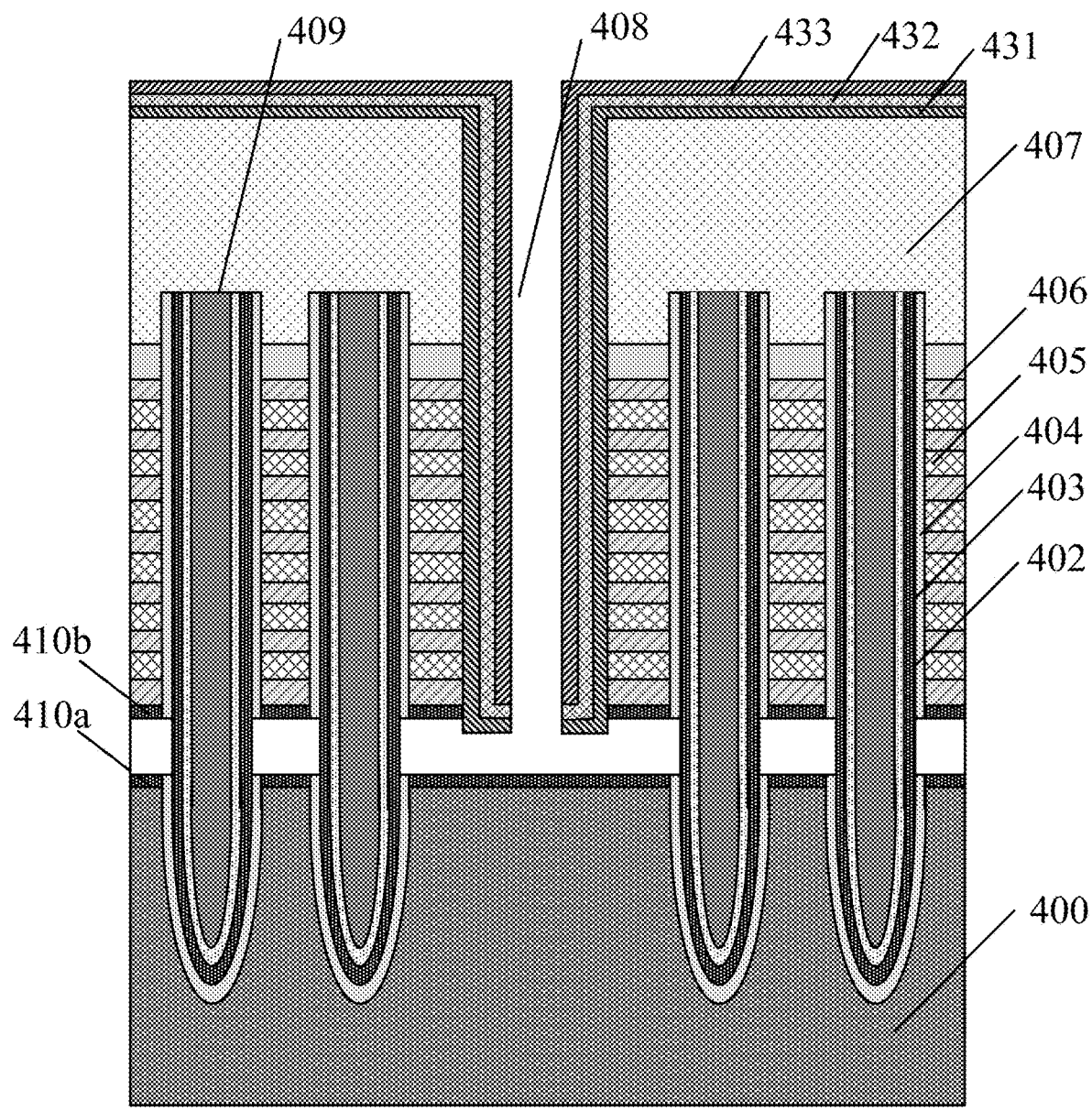

Further, returning to FIG. 3, the exposed portion of the blocking layer may be removed using the first protective layer, the second protective layer, and the third protective layer as an etch mask (S705). FIG. 28 illustrates a schematic cross-sectional view of a semiconductor structure consistent with various embodiments of the present disclosure.

Referring to FIG. 28, the exposed portion of the blocking layer 404 may be removed using the first protective layer 431, the second protective layer 432, and the third protective layer 433 as an etch mask, such that the electron trapping layer 403 may be partially exposed. In one embodiment, the portion of the blocking layer 404 exposed after removing the first sacrificial layer 401 (referring to FIG. 26) may be exposed by a wet etching process. For example, a buffered oxide etching (BOE) process using diluted hydrofluoric acid as an etchant may be adopted to remove the blocking layer 404. Because the diluted hydrofluoric acid demonstrates a substantially higher etching ratio on silicon oxide than on silicon nitride, during the removal of the blocking layer 404, the third protective layer 433 and the first protective layer 431 may not be removed. In one embodiment, the first stop layer 410a and the second stop layer 410b are made of silicon nitride, and correspondingly, when removing the blocking layer 404, the first stop layer 410a and the second stop layer 410b may not be removed. In other embodiments, the first stop layer 410a and the second stop layer 410b are made of silicon oxide, and thus the first stop layer 410a and the second stop layer 410b may be removed when removing the blocking layer 404.

Figure 29:
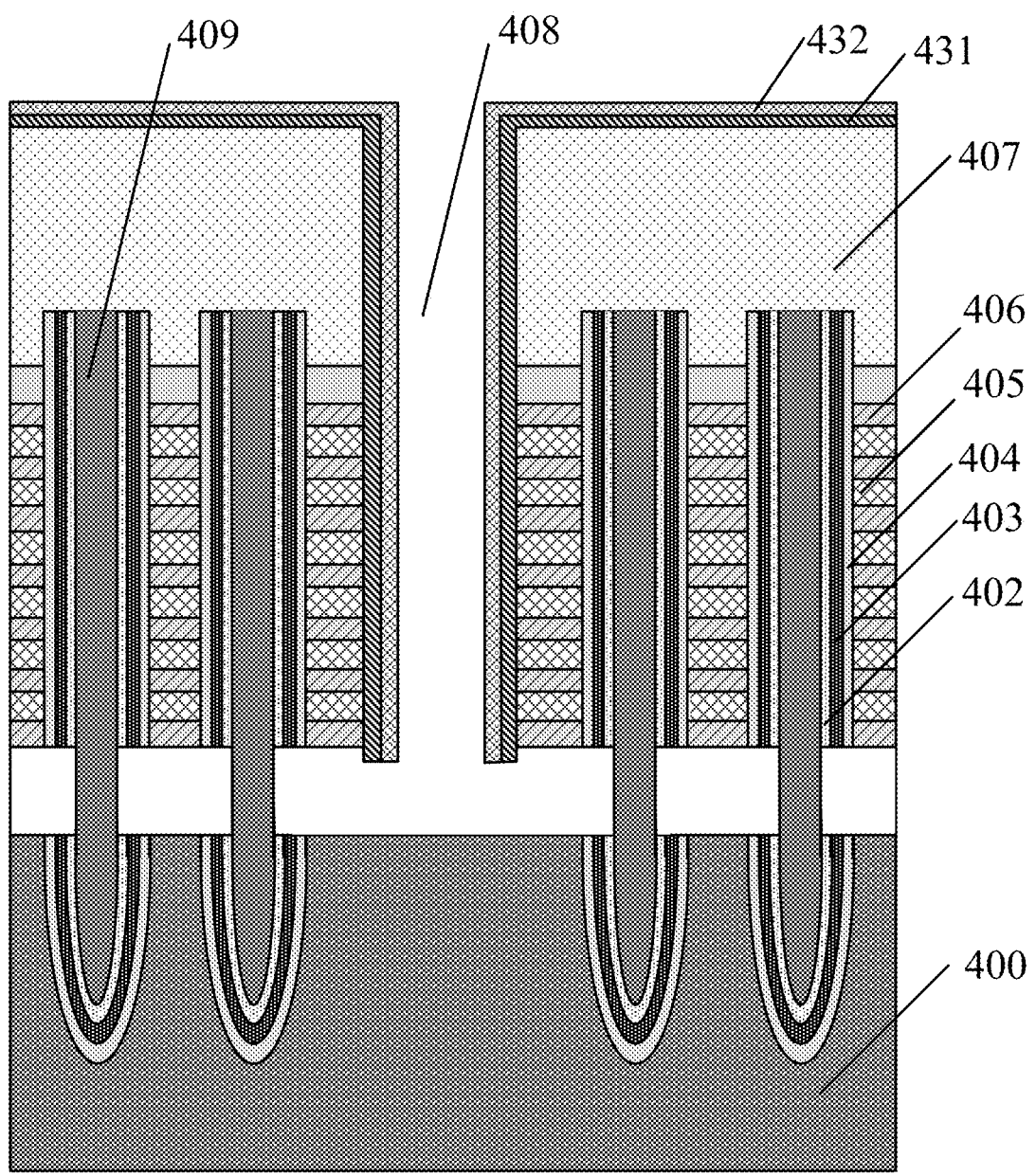

Further, referring to FIG. 23, the portion of the electron trapping layer and the tunneling layer exposed after removing the portion of the blocking layer may be removed (S706). FIG. 29 illustrates a schematic cross-sectional view of a semiconductor structure consistent with various embodiments of the present disclosure.

Referring to FIG. 29, a portion of the electron trapping layer 403 and the tunneling layer 402 exposed after removing the portion of the blocking layer 404 may be removed. In one embodiment, the third protective layer 433 (referring to FIG. 27) may also be removed. For example, during the process of removing the exposed portion of the electron trapping layer 403 and the tunneling layer 402, the third protective layer 433 may be removed. In one embodiment, the electron trapping layer 403 and the tunneling layer 402 together with the third protective layer 433 may be removed by an etching process using phosphoric acid as an etchant. In addition, when the first stop layer 410a and the second stop layer 410b are made of silicon nitride, the first stop layer 410a and the second stop layer 410b may also be removed when removing the electron trapping layer 403, the tunneling layer 402, and the third protective layer 413.

It should be noted that, after removing the third protective layer 433, the second protective layer 432 may be exposed, and in a subsequent process of SEG, silicon may not be able to grow on the exposed surface of the second protective layer 432.

Figure 30:
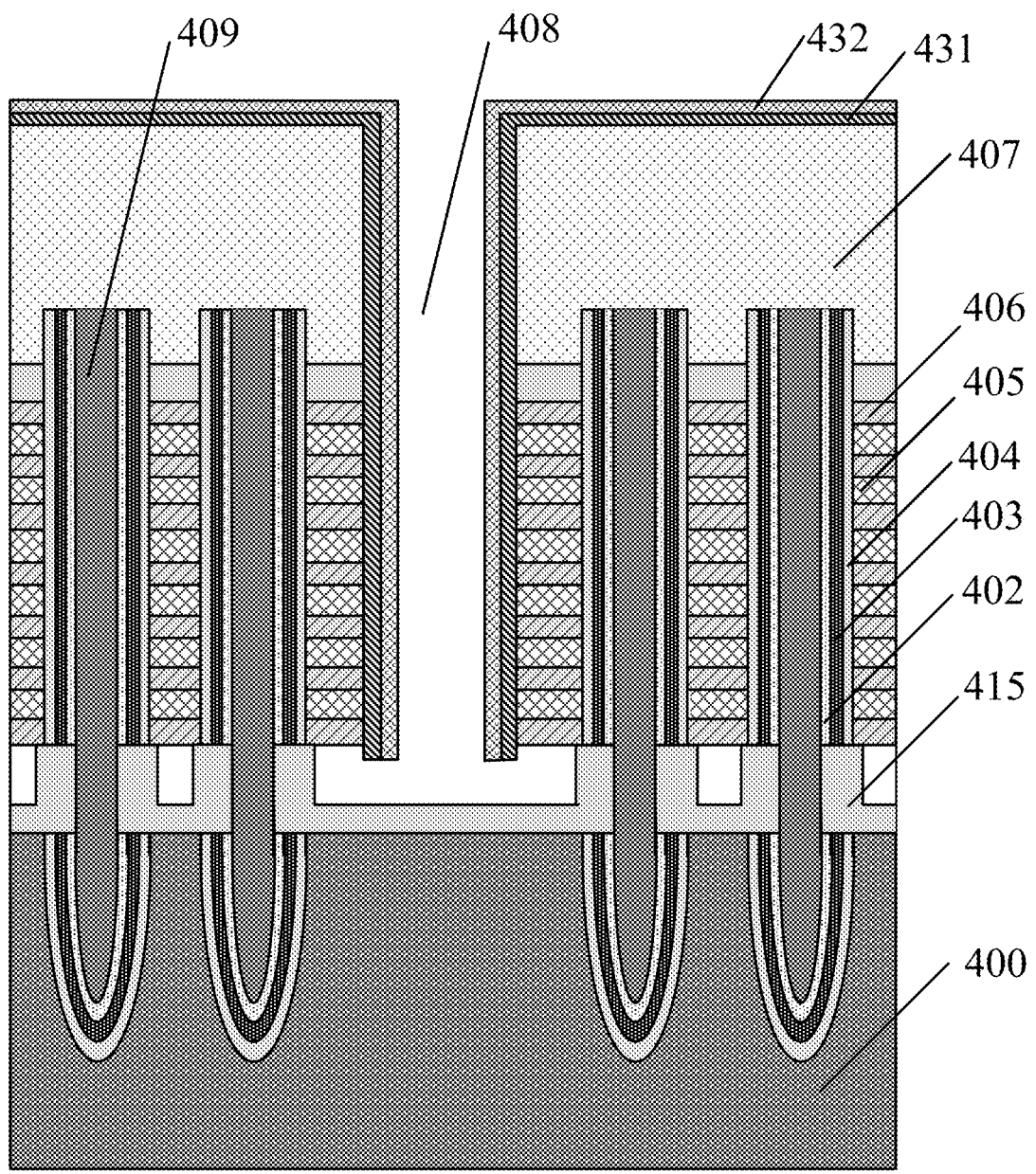

Further, returning to FIG. 23, an epitaxial layer may be formed on the exposed surface of the base substrate and the channel through sidewall SEG (S707). FIG. 30 illustrates a schematic cross-sectional view of a semiconductor structure consistent with various embodiments of the present disclosure.

Referring to FIG. 30, through sidewall SEG, an epitaxial layer 435 may be grown on the exposed surface of the base substrate 400 and the channel 409. In one embodiment, the epitaxial layer may be made of silicon. Because the sidewall surface of the gate-line trench 408 is covered by the second protective layer 432, which is made of silicon oxide, the epitaxial layer 435 may not be formed on the sidewall surface of the gate-line trench 408. As such, forming silicon defects on the plurality of sacrificial layers 405 may be prevented, which is conducive to improving the performance of the semiconductor device.

In some embodiments, after performing the sidewall SEG process, the second protective layer 432, the first protective layer 431, and the plurality of sacrificial layers 405 may be removed, and then a plurality of metal gate layers may be formed to fill the empty spaces formed after removing the plurality of sacrificial layers 405.

According to the disclosed fabrication process, a three-layer structure including a silicon nitride layer, a silicon oxide layer, and a titanium nitride layer is formed on the sidewall surface of the gate-line trench prior to removing a portion of the ONO structure located at the lower end of each channel. As such, when removing the portion of the ONO structure, the three-layer structure may be able to provide protection for the NO stack structure. Therefore, during the removal of the first sacrificial layer and the portion of the ONO structure located at the lower end of each channel, damages to the NO stack structure and the gate-line capping layer may be prevented and the dimension of the gate-line trench may not be increased. In addition, during a subsequent sidewall SEG process, silicon defects may not be formed on the surface of the plurality of sacrificial layers. Therefore, the disclosed method may be able to improve the performance of the formed 3D NAND flash memory.

Compared to existing methods for forming memory devices, the disclosed fabrication methods may demonstrate the following exemplary advantages.

According to the disclosed methods, during the fabrication process of a 3D NAND memory device, a single-layer or multi-layer protective structure is formed on the sidewall surface of the gate-line trench prior to removing a portion of the ONO structure located at the lower end of each channel. The protective structure includes a nitride layer coving the sidewalls of the gate-line trench. As such, when removing the portion of the ONO structure, the single-layer or multi-layer protective structure may be able to provide protection for the NO stack structure. Therefore, during the removal of the first sacrificial layer and the portion of the ONO structure located at the lower end of each channel, damages to the NO stack structure and the gate-line capping layer may be prevented and the dimension of the gate-line trench may not be enlarged. In addition, the protective structure includes multiple layers, and after removing the outermost nitride layer, an oxide layer may be exposed. Therefore, during a subsequent sidewall SEG process, silicon defects may not be formed on the sidewalls of the gate-line trench. Therefore, the disclosed method may be able to improve the performance of the formed 3D NAND flash memory.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a memory device, comprising:
providing an initial semiconductor structure, including a base substrate; a first sacrificial layer formed on the base substrate; a stack structure, disposed on the first sacrificial layer; a plurality of channels, formed through the stack structure and the first sacrificial layer; and a gate-line trench, formed through the stack structure and exposing the first sacrificial layer;
forming at least one protective layer on sidewalls of the gate-line trench through the stack structure;
removing the first sacrificial layer to expose a portion of each of the plurality of channels and surfaces of the base substrate, using the at least one protective layer that is on the sidewalls of the gate-line trench through the stack structure as an etch mask to perform an etch through the gate-line trench; and
forming an epitaxial layer on the exposed surfaces of the base substrate and the plurality of channels.

2. The method according to claim 1, wherein:
the epitaxial layer is made of silicon.

3. The method according to claim 1, wherein:
the initial semiconductor structure further includes a first stop layer formed between the base substrate and the first sacrificial layer, and a second stop layer formed between the first sacrificial layer and the stack structure, wherein:
the plurality of channels are formed through the stack structure, the second stop layer, the first sacrificial layer, and the first stop layer, and
the gate-line trench exposing the first sacrificial layer is formed through the stack structure and the second stop layer; and
the method further includes removing the first stop layer and the second stop layer when removing the blocking layer or when removing the electron trapping layer and the tunneling layer.

4. The method according to claim 1, wherein forming the at least one protective layer on the sidewalls of the gate-line trench includes:
forming a first protective layer made of a first material on a bottom and sidewalls of the gate-line trench and forming a second protective layer made of a second material on the first protective layer;
removing a portion of the first protective layer and the second protective layer formed on the bottom of the gate-line trench;
forming a third protective layer made of a third material on the second protective layer and the first sacrificial layer exposed at the bottom of the gate-line trench; and
removing a portion of the third protective layer formed on the bottom of the gate-line trench.

5. The method according to claim 4, wherein:
the first material is same as the third material; and
the first material is different from the second material.

6. The method according to claim 4, wherein:
the first material, the second material, and the third material are different from each other.

7. The method according to claim 4, wherein:
the first sacrificial layer is made of polycrystalline silicon;
the first material includes silicon nitride;
the second material includes silicon oxide; and
the third material includes silicon nitride.

8. The method according to claim 4, wherein:
a thickness of the first protective layer is in a range of approximately 2 nm to 5 nm;

a thickness of the second protective layer is in a range of approximately 10 nm to 15 nm; and
a thickness of the third protective layer is in a range of approximately 15 nm to 30 nm.

9. The method according to claim 4, further including:
prior to forming the epitaxial layer, removing the third protective layer; and
after forming the epitaxial layer, removing the second protective layer and the first protective layer.

10. The method according to claim 9, wherein:
the stack structure includes a plurality of interlayer dielectric layers and a plurality of sacrificial layers that are alternately arranged; and
the method further includes replacing the plurality of sacrificial layers with gate layers after removing the first protective layer.

11. The method according to claim 1, wherein:
the initial semiconductor structure further includes a tunneling layer, an electron trapping layer, and a blocking layer formed between each of the plurality of channels and the stack structure; and
before forming the epitaxial layer, the method further includes removing a portion of each of the tunneling layer, the electron trapping layer, and the blocking layer formed on a surface portion of each of the plurality of channels.

12. The method according to claim 11, wherein removing the portion of each of the tunneling layer, the electron trapping layer, and the blocking layer includes:
removing the portion of the blocking layer while or after removing the first sacrificial layer; and
removing the portion of the electron trapping layer and the portion of the tunneling layer to expose the surface portion of each channel before forming the epitaxial layer.

13. A method for forming a memory device, comprising:
providing an initial semiconductor structure, including a base substrate; a first stop layer formed on the base substrate; a first sacrificial layer formed on the first stop layer; a second stop layer disposed on the first sacrificial layer; a stack structure, disposed on the second stop layer; a plurality of channels formed through the stack structure and into the base substrate; and a gate-line trench, formed through the stack structure and exposing the first sacrificial layer;
forming a protective layer on a bottom and sidewalls of the gate-line trench;
removing a portion of the protective layer formed on the bottom of the gate-line trench;
removing the first sacrificial layer to expose a portion of each of the plurality of channels and surfaces of the base substrate, using the protective layer as an etch mask; and
forming an epitaxial layer on the exposed surfaces of the base substrate and the plurality of channels.

14. The method according to claim 13, wherein:
the first sacrificial layer is made of polycrystalline silicon; and
the protective layer is made of titanium nitride.

15. The method according to claim 13, wherein:
the epitaxial layer is made of silicon.

16. The method according to claim 13, prior to forming the epitaxial layer, further including:
removing the protective layer.

17. The method according to claim 16, wherein:
the stack structure includes a plurality of interlayer dielectric layers and a plurality of sacrificial layers that are alternately arranged; and
the method further includes replacing the plurality of sacrificial layers with gate layers after removing the protective layer.

18. The method according to claim 13, wherein:
the initial semiconductor structure further includes a tunneling layer, an electron trapping layer, and a blocking layer formed between each of the plurality of channels and the stack structure; and
before forming the epitaxial layer, the method further includes removing a portion of each of the tunneling layer, the electron trapping layer, and the blocking layer formed on a surface portion of each of the plurality of channels.

19. The method according to claim 18, wherein removing the portion of each of the tunneling layer, the electron trapping layer, and the blocking layer includes:
removing the portion of the blocking layer while or after removing the first sacrificial layer; and
removing the portion of the electron trapping layer and the portion of the tunneling layer to expose the surface portion of each channel before forming the epitaxial layer.

20. The method according to claim 19, further comprising:
removing the first stop layer and the second stop layer when removing the blocking layer or when removing the electron trapping layer and the tunneling layer.

\* \* \* \* \*